(12) United States Patent
Suzuki

(10) Patent No.: US 9,645,206 B2
(45) Date of Patent: May 9, 2017

(54) BIRDCAGE-TYPE HIGH-FREQUENCY COIL AND MAGNETIC RESONANCE IMAGING APPARATUS

(75) Inventor: Shinichiro Suzuki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 613 days.

(21) Appl. No.: 14/129,175

(22) PCT Filed: Jul. 18, 2012

(86) PCT No.: PCT/JP2012/068145
§ 371 (c)(1),
(2), (4) Date: Dec. 24, 2013

(87) PCT Pub. No.: WO2013/018541
PCT Pub. Date: Feb. 7, 2013

(65) Prior Publication Data
US 2014/0145722 A1     May 29, 2014

(30) Foreign Application Priority Data

Jul. 30, 2011 (JP) ................................ 2011-167845

(51) Int. Cl.
*G01V 3/00* (2006.01)
*G01R 33/34* (2006.01)
*G01R 33/36* (2006.01)

(52) U.S. Cl.
CPC ... *G01R 33/34076* (2013.01); *G01R 33/3628* (2013.01); *G01R 33/34007* (2013.01)

(58) Field of Classification Search
CPC .......... G01R 33/34076; G01R 33/3628; G01R 33/34007

(Continued)

(56) References Cited

U.S. PATENT DOCUMENTS 4,694,255 A      9/1987  Hayes
5,144,240 A  *  9/1992  Mehdizadeh ...... G01R 33/3628
                                                        324/322

(Continued)

FOREIGN PATENT DOCUMENTS

CA      2255825 C  *  5/2002  ....... G01R 33/34046
JP      60-132547           7/1985

(Continued)

OTHER PUBLICATIONS

International Search Report in PCT/JP2012/068145.

(Continued)

*Primary Examiner* — Susan Lee
(74) *Attorney, Agent, or Firm* — Cooper & Dunham LLP

(57) ABSTRACT

In order to allow the capacitances of a plurality of resonance capacitor elements inserted in a ring-shaped conductor element of a birdcage-type high-frequency coil to be collectively adjusted in a balanced manner without the need to perform adjustment separately, there is provided a birdcage-type high-frequency coil including two ring-shaped conductor elements in which a plurality of resonance capacitor elements are inserted in series and a plurality of linear conductor elements electrically connected to the two ring-shaped conductor elements. An adjustment belt to change the apparent capacitances of the plurality of resonance capacitor elements collectively is slidably disposed on the outer periphery of at least one of the two ring-shaped conductor elements with a dielectric member interposed therebetween.

16 Claims, 17 Drawing Sheets

(58) Field of Classification Search
USPC .......................................................... 324/322
See application file for complete search history.

(56) References Cited

U.S. PATENT DOCUMENTS

| | | | | |
|---|---|---|---|---|
| 6,236,206 B1* | 5/2001 | Hartman | ............ | G01R 33/3628 324/322 |
| 6,316,941 B1* | 11/2001 | Fujita | ............... | G01R 33/34046 324/322 |
| 6,396,271 B1 | 5/2002 | Burl et al. | | |
| 6,420,871 B1* | 7/2002 | Wong | ............... | G01R 33/34046 324/322 |
| 6,452,393 B1* | 9/2002 | Allen | ............... | G01R 33/34046 324/322 |
| 6,522,143 B1* | 2/2003 | Fujita | ............... | G01R 33/34046 324/322 |
| 6,876,200 B2* | 4/2005 | Anderson | ........ | G01R 33/34046 324/322 |
| 7,123,012 B2* | 10/2006 | Srinivasan | ....... | G01R 33/34046 324/318 |
| 8,680,863 B1* | 3/2014 | Qian | ................ | G01R 33/34076 324/322 |
| 2004/0189304 A1* | 9/2004 | Anderson | ........ | G01R 33/34046 324/322 |
| 2010/0253338 A1 | 10/2010 | Eryaman et al. | | |

FOREIGN PATENT DOCUMENTS

| | | |
|---|---|---|
| JP | 62-129044 | 6/1987 |
| JP | 2001-112738 | 4/2001 |
| JP | 2002-543391 | 12/2002 |
| JP | 2011-510325 | 3/2011 |

OTHER PUBLICATIONS

Mark C. Leifer, "Theory of the quadrature elliptic birdcage coil", Magnetic Resonance in Medicine, Nov. 1997, vol. 38, No. 5, 726.

* cited by examiner

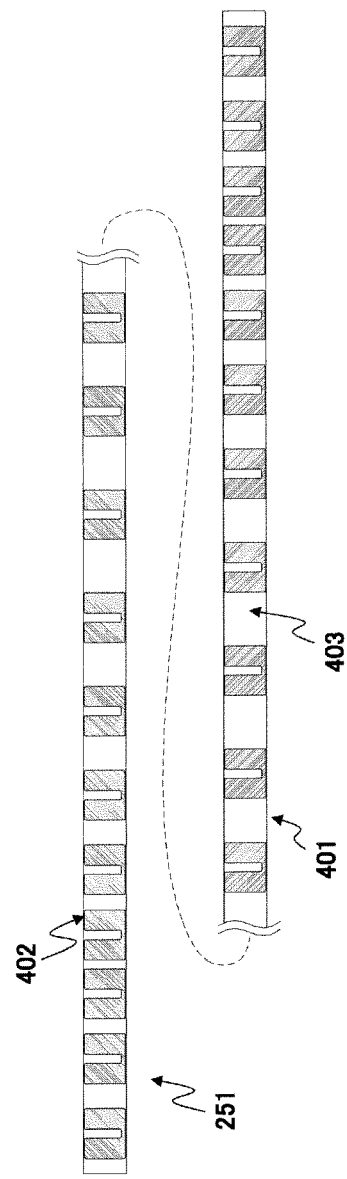

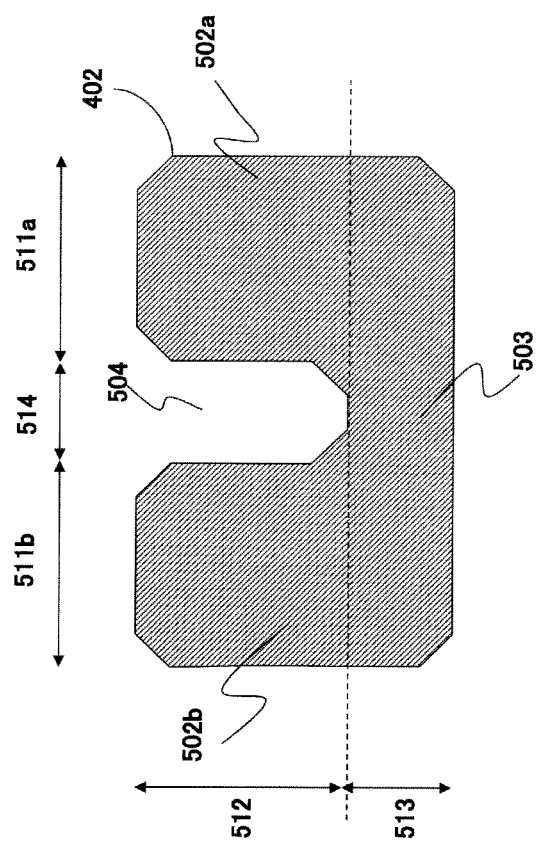

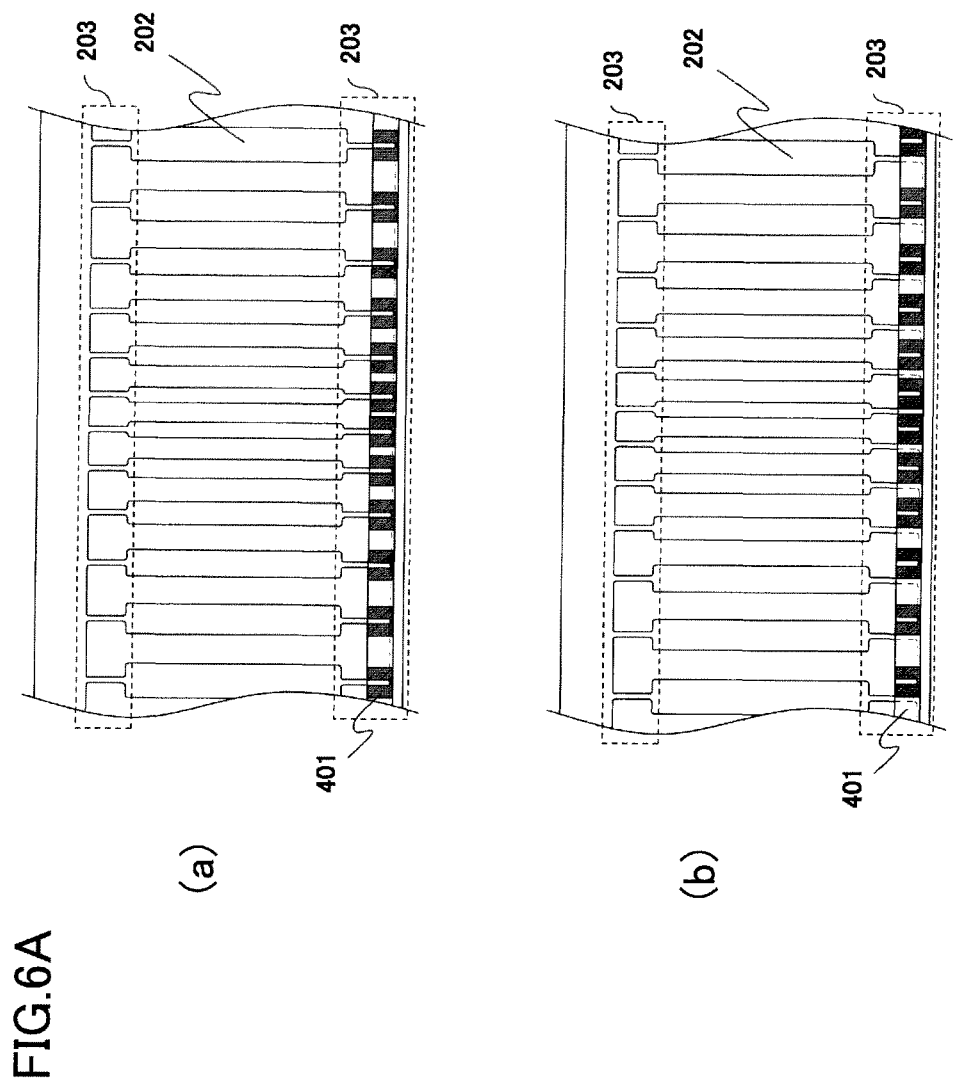

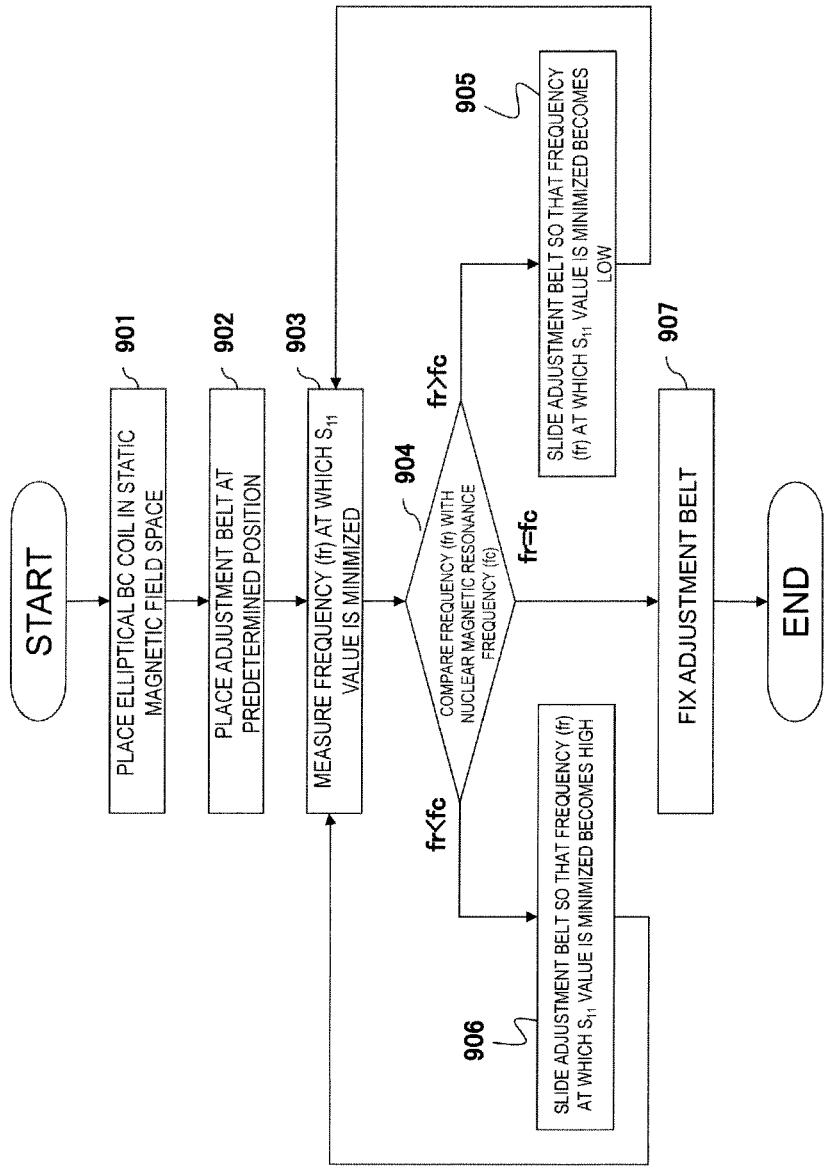

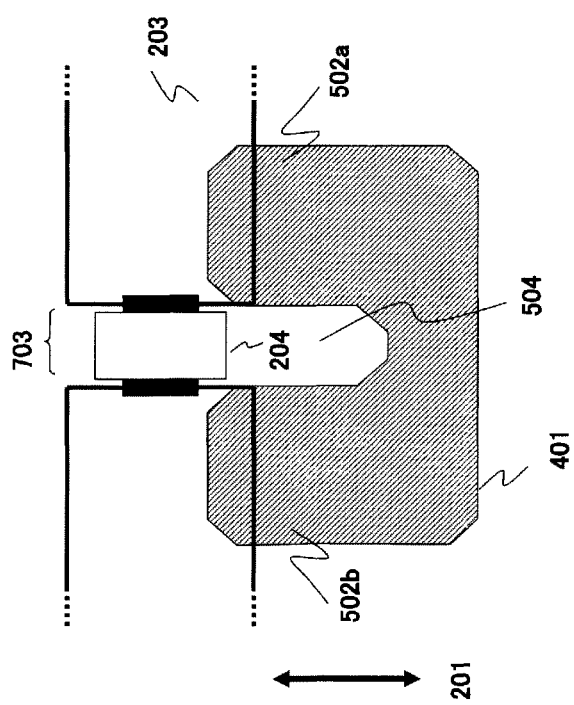

FIG.10B
(a)
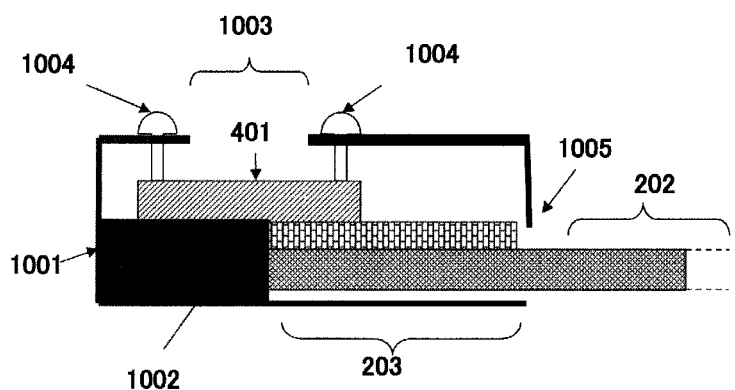
(b)
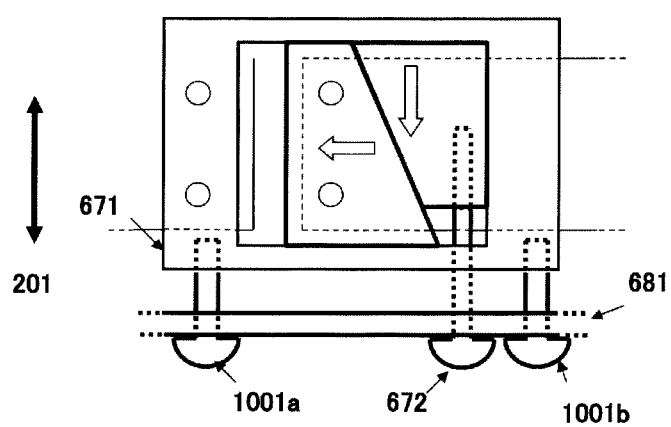

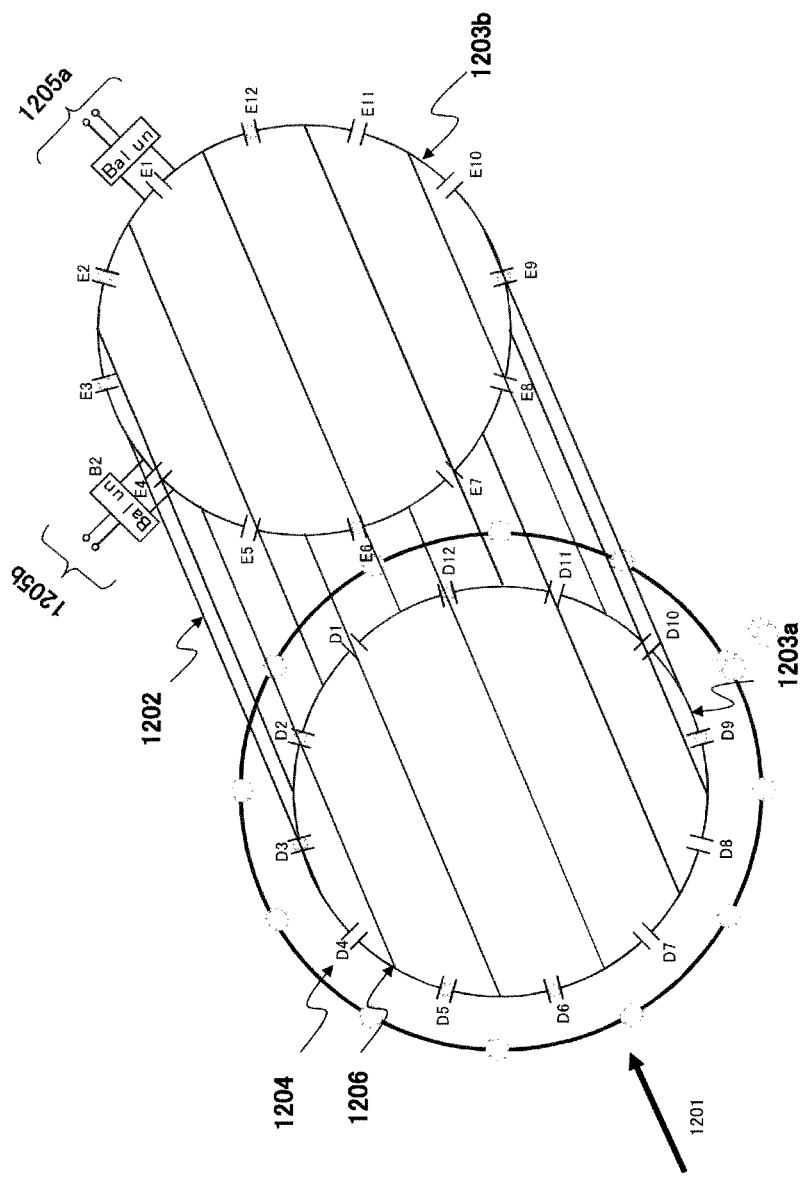

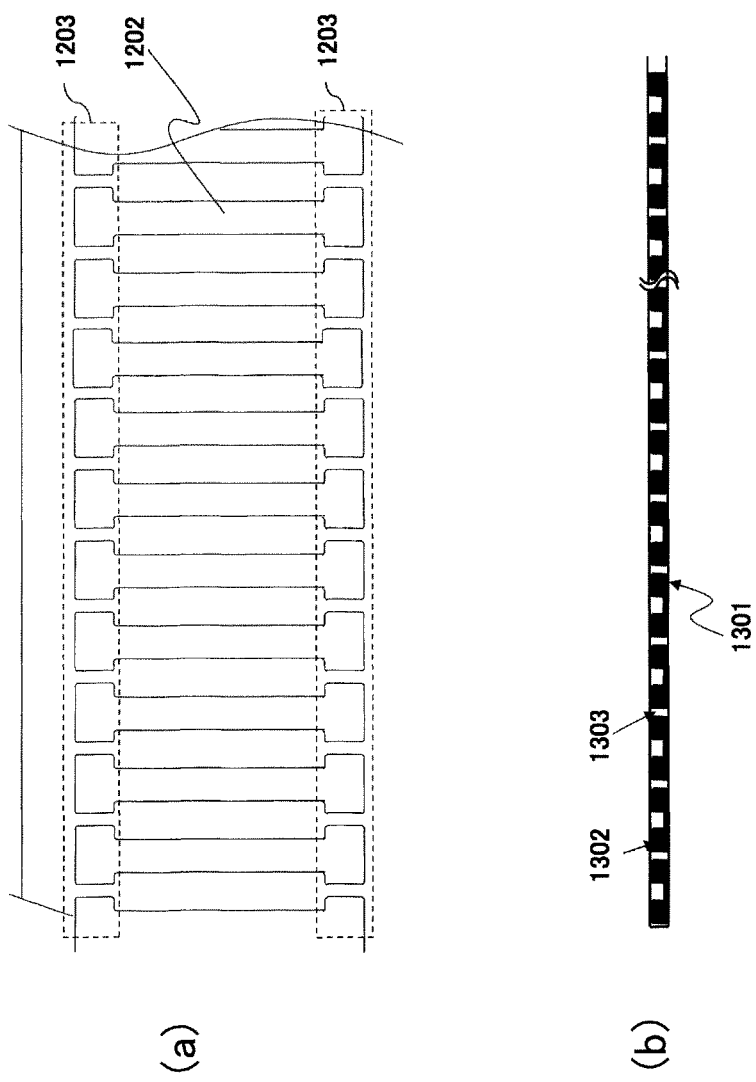

BIRDCAGE-TYPE HIGH-FREQUENCY COIL AND MAGNETIC RESONANCE IMAGING APPARATUS

TECHNICAL FIELD

The present invention relates to a magnetic resonance imaging (hereinafter, referred to as an "MRI") apparatus and in particular, to adjustment of a birdcage-type high-frequency coil (hereinafter, referred to as a birdcage coil or a BC coil)

BACKGROUND ART

The MRI apparatus is an apparatus that measures an NMR signal, which is generated by the spins of nuclei that form an object when irradiating the object with a high-frequency magnetic field pulse (hereinafter, referred to as an RF pulse), and images the shapes or functions of the head, abdomen, limbs, and the like in a two-dimensional manner or in a three-dimensional manner. In the imaging, different phase encoding and different frequency encoding are given to NMR signals by the gradient magnetic field, and the NMR signals are measured as time-series data. The measured NMR signals are reconstructed as an image by a two-dimensional or three-dimensional Fourier transform.

In the above-described MRI apparatus, when irradiating a desired part of an object with an RF pulse, an RF transmission coil is disposed around the desired part and an RF pulse having a nuclear magnetic resonance frequency, which is determined according to the static magnetic field strength and the excitation target nuclide, is supplied to the RF transmission coil. Therefore, design or adjustment (tuning) of the RF transmission coil is performed so that the resonance frequency of the RE transmission coil becomes a nuclear magnetic resonance frequency that is the frequency of the RE pulse.

Among the above-described RF transmission coils, a BC coil is used especially in the horizontal magnetic field type MRI apparatus.

In the case of a cylindrical BC coil, a plurality of linear conductor elements are disposed at equal distances along the circumference of the cylindrical shape in parallel with the central axis of the cylindrical shape, and circular ring-shaped conductor elements electrically connected to the plurality of linear conductor elements are disposed at both ends of the BC coil. In this ring-shaped conductor element, a plurality of resonance capacitor elements (capacitors) having the same capacitance are inserted in series, so that the capacitance of each of these resonance capacitor elements is adjusted at the time of adjustment (tuning) of the Q value or the resonance frequency of the RF transmission coil.

PTL 1 discloses a multilayer structure of an outside (external) ring and an inside ring in a two-frequency tuning birdcage-type coil. An example of performing tuning by appropriately setting the inductance of the outside ring or the capacitance between the inside ring and the outside ring in this coil is disclosed.

CITATION LIST

Patent Literature

[PTL 1] JP-T-2003-516770

SUMMARY OF INVENTION

Technical Problem

In the tuning mechanism disclosed in PTL 1, since the inductance of the outside ring or the capacitance between the inside ring and the outside ring needs to be set and adjusted separately, it is thought to be difficult to easily adjust the capacitances of the plurality of resonance capacitor elements, which are inserted in series in each ring-shaped conductor element, collectively. For this reason, since the respective resonance capacitor elements are adjusted separately, the adjustment operation is complicated.

Therefore, the present invention has been made in view of the above-described problem, and it is an object of the present invention to provide a BC coil, in which the capacitances of a plurality of resonance capacitor elements inserted in each ring-shaped conductor element of the BC coil can be collectively adjusted in a balanced manner without the need to perform adjustment separately, and an MRI apparatus using the BC coil.

Solution to Problem

In order to achieve the above-described object, the present invention is a birdcage-type high-frequency coil including a ring-shaped conductor element in which a plurality of resonance capacitor elements are inserted in series and a plurality of linear conductor elements electrically connected to the ring-shaped conductor element. An adjustment belt to change the apparent capacitances of the plurality of resonance capacitor elements collectively is slidably disposed on the outer periphery of the ring-shaped conductor element with a dielectric member interposed therebetween.

Advantageous Effects of Invention

According to the BC coil and the MRI apparatus using the same of the present invention, it is possible to adjust the capacitances of the plurality of resonance capacitor elements, which are inserted in the ring-shaped conductor element of the BC coil, collectively in a balanced manner without adjusting the capacitances separately.

BRIEF DESCRIPTION OF DRAWINGS

FIG. 4 is a diagram showing an example of an adjustment belt of the first embodiment.

FIG. 5 is a diagram showing an example of the shape of a conductor piece.

FIG. 6A is a developed diagram obtained by cutting an elliptical BC coil with a tuning mechanism of the first embodiment in parallel with the central axis and expanding the result to the left and right.

Figure 8:
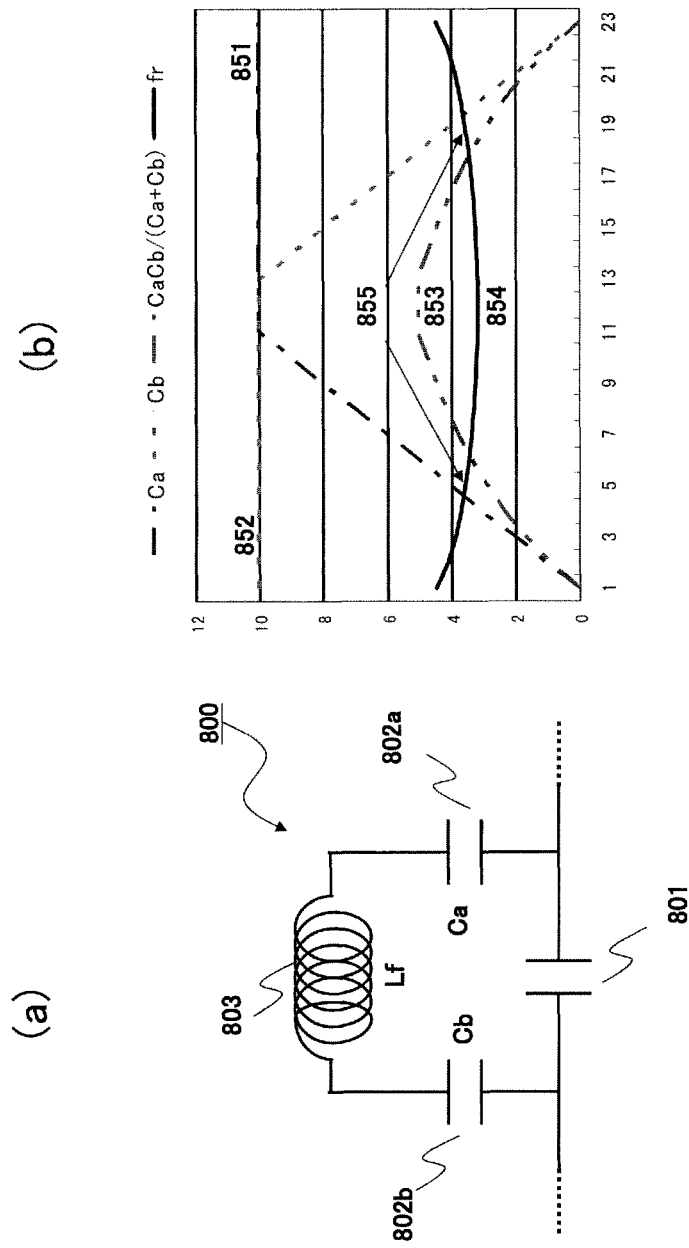

(a) in FIG. 8 is a diagram showing an equivalent circuit when a conductor piece and a resonance capacitor element of the first embodiment are combined, and (b) in FIG. 8 is a graph showing changes in various values according to the sliding movement of the adjustment belt.

FIG. 9 is a flowchart showing the tuning procedure using the tuning mechanism of the elliptical BC coil of the first embodiment.

FIG. 10A is an enlarged view when an arbitrary resonance capacitor element and a conductor portion near the resonance capacitor element in an elliptical ring-shaped conductor element and a conductor piece 4 in an adjustment belt, which is present at a position facing the resonance capacitor element, are viewed from a direction perpendicular to the elliptical cylindrical curved surface in a second embodiment.

(a) in FIG. 10B is a cross-sectional view of a guide groove 651 provided at the bobbin end of an elliptical BC coil of the second embodiment, and (b) in FIG. 10B is a diagram showing another example of the structure for fixing the position of the adjustment belt of the second embodiment.

Figure 11:
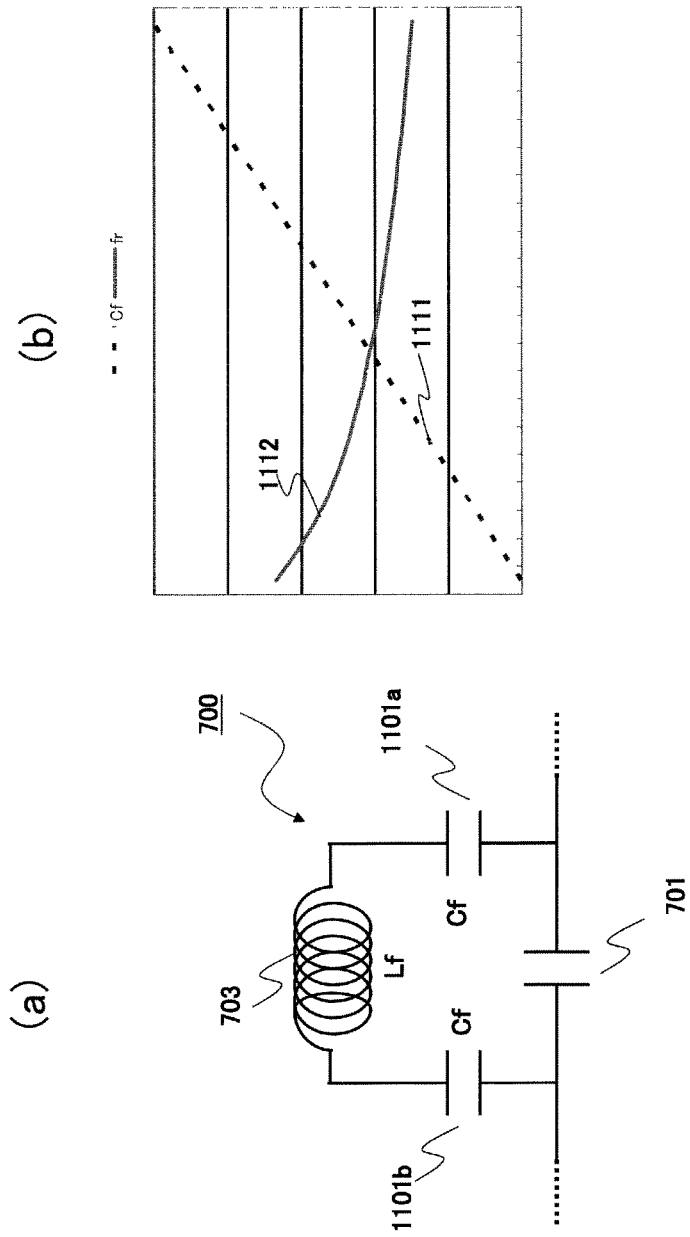

(a) in FIG. 11 is a diagram showing an equivalent circuit when a conductor piece and a resonance capacitor element of the second embodiment are combined, and (b) in FIG. 11 is a graph showing changes in various values according to the sliding movement of the adjustment belt.

FIG. 12 is a perspective view when a circular BC coil of a third embodiment is obliquely viewed.

(a) in FIG. 13 is a developed diagram obtained by cutting an example of the circular BC coil of the third embodiment in parallel with the central axis and expanding the result to the left and right, and (b) in FIG. 13 is a diagram showing an adjustment belt of a tuning mechanism of the circular BC coil of the third embodiment.

DESCRIPTION OF EMBODIMENTS

Hereinafter, preferred embodiments of an MRI apparatus of the present invention will be described in detail with reference to the accompanying diagrams. In addition, in all diagrams for explaining the embodiments of the invention, the same reference numerals are given to component having the same functions, and repeated explanation thereof will be omitted.

Figure 1:
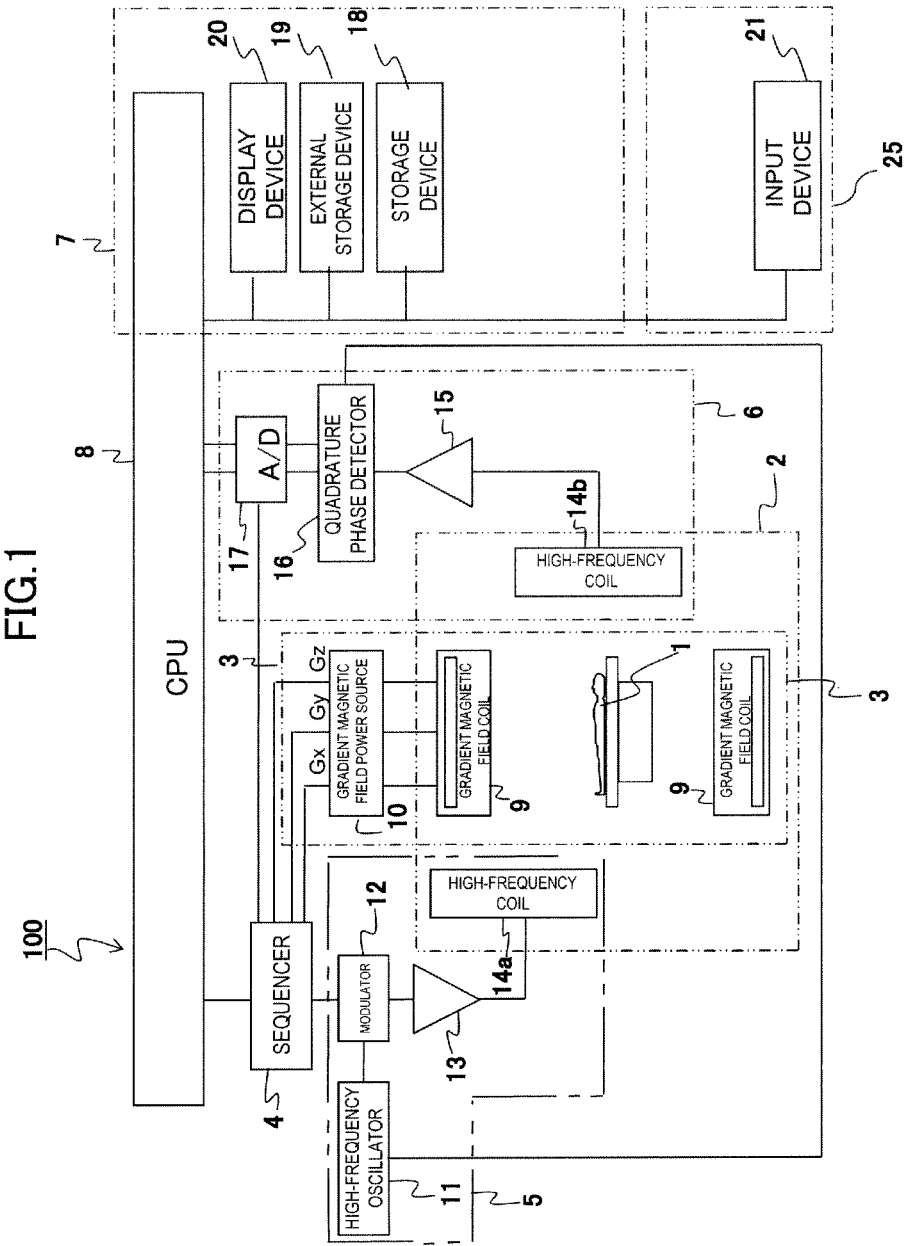
FIG. 1 is a block diagram showing the overall configuration of an embodiment of an MRI apparatus related to the present invention.

First, a complete overview of an example of an MRI apparatus according to the present invention will be given with reference to FIG. 1. FIG. 1 is a block diagram showing the overall configuration of an embodiment of the MRI apparatus according to the present invention. This MRI apparatus acquires a tomographic image of an object using an NMR phenomenon. As shown in FIG. 1, the MRI apparatus is configured to include a static magnetic field generation system 2, a gradient magnetic field generation system 3, a signal transmission system 5, a signal receiving system 6, a signal processing system 7, a sequencer 4, and a central processing unit (CPU) 8.

The static magnetic field generation system 2 generates a uniform static magnetic field in space around an object 1 in a direction perpendicular to the body axis in the case of a perpendicular magnetic field method and in the body axis direction in the case of a horizontal magnetic field method. A permanent magnet type, normal conduction type, or superconducting type static magnetic field generator is disposed around the object 1.

The gradient magnetic field generation system 3 includes gradient magnetic field coils 9 that apply a gradient magnetic field in three axial directions of X, Y, and Z, which are the coordinate system (stationary coordinate system) of the MRI apparatus, and a gradient magnetic field power source 10 that drives each gradient magnetic field coil, and applies gradient magnetic fields Gx, Gy, and Gz in the three axial directions of X, Y, and Z by driving the gradient magnetic field power source 10 of each coil according to a command from the sequencer 4, which will be described later. At the time of imaging, a slice direction gradient magnetic field pulse (Gs) is applied in a direction perpendicular to the slice surface (imaging cross-section) in order to set the slice surface for the object 1, and a phase encoding direction gradient magnetic field pulse (Gp) and a frequency encoding direction gradient magnetic field pulse (Gf) are applied in the two remaining directions, which are perpendicular to the slice surface and are also perpendicular to each other, so that the position information in each direction is encoded in the echo signal.

The sequencer 4 is control means for repeatedly applying a high-frequency magnetic field pulse (hereinafter, referred to as an "RF pulse") and a gradient magnetic field pulse according to a predetermined pulse sequence, and operates under the control of the CPU 8 and transmits various commands, which are required to collect data of a tomographic image of the object 1, to the signal transmission system 5, the gradient magnetic field generation system 3, and the signal receiving system 6.

The signal transmission system 5 emits RF pulses to the object 1 in order to cause nuclear magnetic resonance in the nuclear spins of atoms which form the body tissue of the object 1, and is configured to include a high-frequency oscillator 11, a modulator 12, a high-frequency amplifier 13, and a transmission-side high-frequency coil (transmission coil) 14a. RF pulses output from the high-frequency oscillator 11 are amplitude-modulated by the modulator 12 at the timing according to the command from the sequencer 4, and the amplitude-modulated RF pulses are amplified by the high-frequency amplifier 13 and are then supplied to the high-frequency coil 14a disposed adjacent to the object 1. As a result, RF pulses are emitted to the object 1.

The signal receiving system 6 detects an echo signal (NMR signal) emitted by nuclear magnetic resonance of the nuclear spins, which form the body tissue of the object 1, and is configured to include a receiving-side high-frequency coil (receiving coil) 14b, a signal amplifier 15, a quadrature phase detector 16, and an A/D converter 17. The NMR signal of the response of the object 1 induced by the electromagnetic waves emitted from the transmission-side high-frequency coil 14a is detected by the high-frequency coil 14b disposed adjacent to the object 1 and is amplified by the signal amplifier 15. Then, at a timing according to the command from the sequencer 4, the NMR signal is divided into two signals perpendicular to each other by the quadrature phase detector 16, and each of the signals is converted into a digital amount by the A/D converter 17 and is transmitted to the signal processing system 7.

The signal processing system 7 performs display, saving, and the like of various kinds of data processing and processing results, and includes a storage device 18 such as a RAM and a ROM, an external storage device 19 such as an optical disc or a magnetic disk, and a display device 20 such as a liquid crystal display. When data from the signal receiving system 6 is input to the CPU 8, the CPU 8 executes processing, such as signal processing and image reconstruction, and displays a tomographic image of the object 1, which is the result, on the display device 20 and also records the tomographic image on the external storage device 19.

An operating unit 25 inputs various kinds of control information of the MRI apparatus or control information of processing performed in the signal processing system 7, and is configured to include an input device 21, such as a track ball, a mouse, and a keyboard. The operating unit 25 is disposed adjacent to the display device 20, so that the operator controls various kinds of processing of the MRI apparatus interactively through the operating unit 25 while watching the display device 20.

In addition, in FIG. 1, the transmission-side high-frequency coil 14a and the gradient magnetic field coil 9 are provided in the static magnetic field space of the static magnetic field generation system 2, into which the object 1 is inserted, so as to face the object 1 in the case of the perpendicular magnetic field type and so as to surround the object 1 in the case of the horizontal magnetic field type. In addition, the receiving-side high-frequency coil 14b is provided so as to face or surround the object 1.

Currently, nuclides imaged by an MRI apparatus, which are widely used clinically, are a hydrogen nucleus (proton) that is a main component material of the object. The shapes or functions of the head, abdomen, limbs, and the like of the human body are imaged in a two-dimensional or three-dimensional manner by imaging the information regarding the spatial distribution of the proton density or the spatial distribution of the relaxation time of the excited state.

First, the outline of the present invention will be described. In the present invention, in a BC coil, an adjustment belt to change the apparent capacitances of a plurality of resonance capacitor elements collectively is slidably disposed on the outer periphery of a ring-shaped (loop-shaped) conductor element with a dielectric member interposed therebetween. Specifically, there is provided a BC coil including: two ring-shaped conductor elements in which a plurality of resonance capacitor elements are inserted in series; and a plurality of linear conductor elements electrically connected to the two ring-shaped conductor elements. An adjustment belt to change apparent capacitances of the plurality of resonance capacitor elements collectively is slidably disposed on an outer periphery of at least one of the two ring-shaped conductor elements with a dielectric member interposed therebetween.

The adjustment belt has a belt shape, and is formed by arranging a conductor piece and a slit portion, which insulates the adjacent conductor pieces from each other, alternately. The adjustment belt is formed in an annular shape in a state where the adjustment belt is disposed at the outer periphery of the ring-shaped conductor element. In addition the conductor piece is disposed near a position facing the resonance capacitor element in a state where the adjustment belt is disposed on the outer periphery of the ring-shaped conductor element. Accordingly, stray capacitance is generated between the conductor piece and a conductor portion of the ring-shaped conductor element in parallel with the resonance capacitor element. Since the stray capacitance is changed by the sliding movement of the adjustment belt relative to the ring-shaped conductor element, the combined capacitance of the stray capacitance and the capacitance of the resonance capacitor element changes according to the amount of sliding movement of the adjustment belt. The apparent capacitance when viewed from both ends of the resonance capacitor element disposed in the ring-shaped conductor element is the combined capacitance.

Therefore, since the apparent capacitances of a plurality of resonance capacitor elements can be changed collectively according to the amount of sliding movement of the adjustment belt, it is possible to tune the resonance frequency of the BC coil. Hereinafter, the change in the capacitance of the resonance capacitor element means changing the apparent capacitance of the resonance capacitor element by changing the stray capacitance as described above instead of actually changing the capacitance of the resonance capacitor element itself.

Hereinafter, each embodiment of the present invention will be described in detail.

<<First Embodiment>>

Hereinafter, a first embodiment of the present invention will be described. The first embodiment is an elliptical cylindrical BC coil (hereinafter, referred to as an elliptical BC coil) having an ellipse as a cross-sectional shape of a BC coil. That is, in the elliptical BC coil of the first embodiment, the shape of a ring-shaped conductor element is an ellipse, and a plurality of linear conductor elements are disposed along the elliptical ring-shaped cylindrical curved surface. In addition, an adjustment belt to change the capacitances of a plurality of resonance capacitor elements, which are inserted in series in an elliptical ring-shaped conductor element, collectively is disposed on the outer periphery of the elliptical ring-shaped conductor element with a dielectric sheet, which also serves to insulate the adjustment belt and the elliptical ring-shaped conductor elements from each other, interposed therebetween so as to be slidable in the circumferential direction of the elliptical ring-shaped conductor element. A plurality of conductor pieces are disposed in the adjustment belt, and the adjustment belt is slid in the circumferential direction of the elliptical ring-shaped conductor element to change the stray capacitance formed between the conductor piece and the elliptical ring-shaped conductor element. Accordingly, since the capacitances of the plurality of resonance capacitor elements disposed in the elliptical ring-shaped conductor element are changed collectively, the resonance frequency of the elliptical BC coil is changed.

Figure 2A:
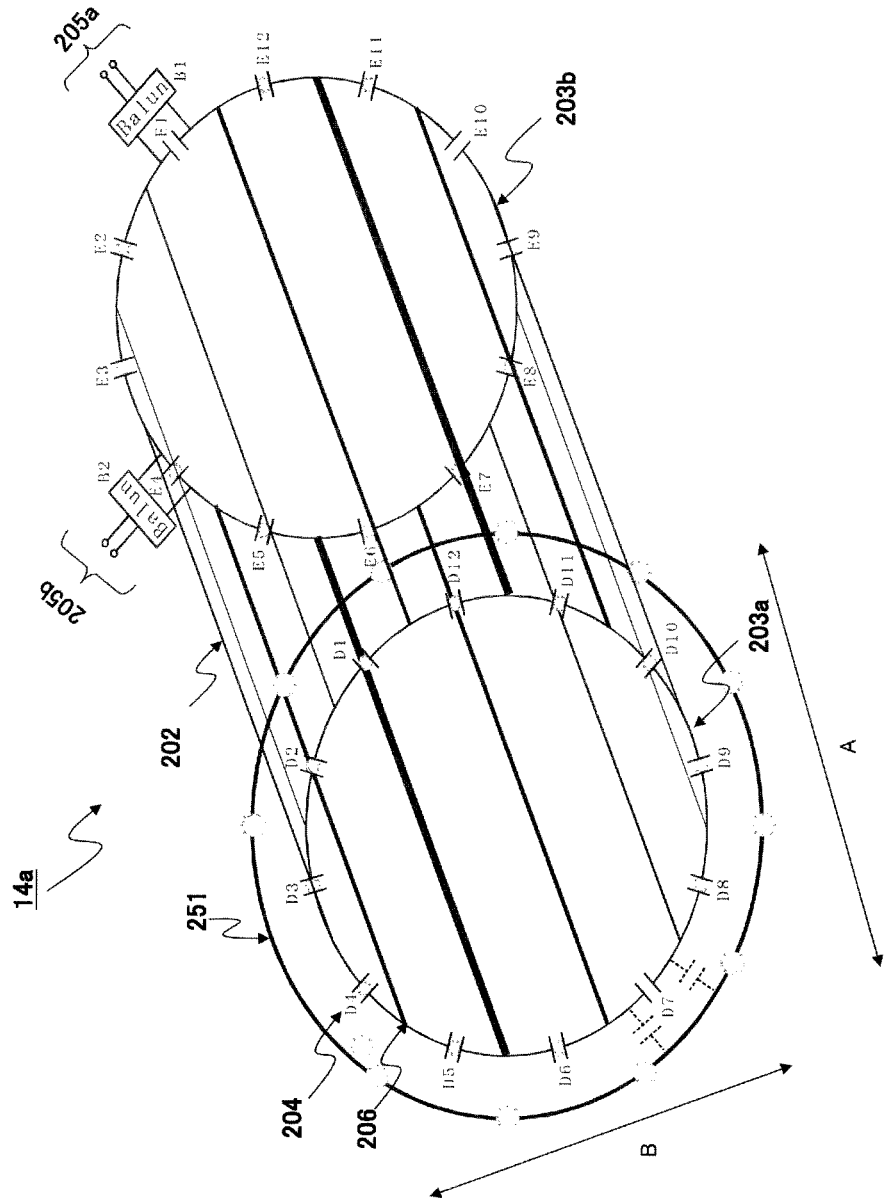
FIG. 2A is a perspective view when an elliptical BC coil of the first embodiment is obliquely viewed.
Figure 2B:
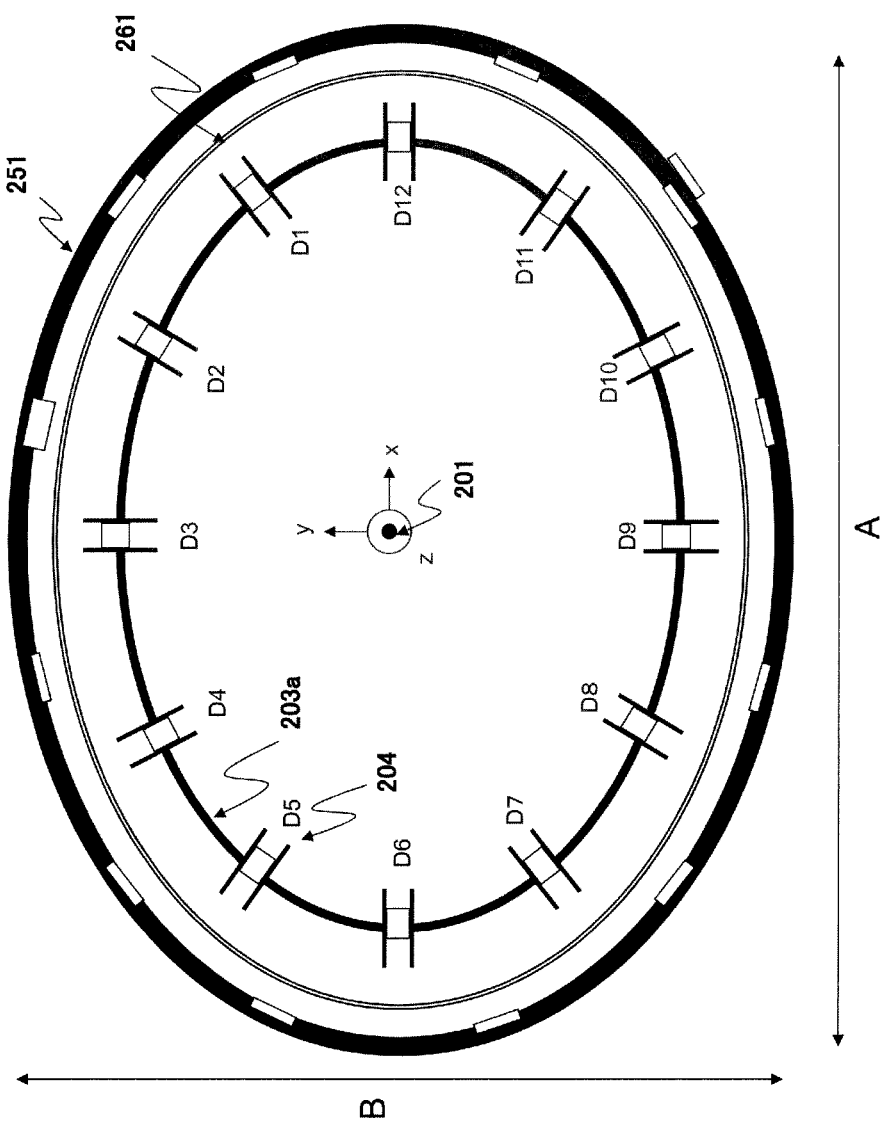
FIG. 2B is a diagram when the elliptical BC coil of the first embodiment is viewed from one side in the central axis 201 direction.

First, the structure of the elliptical BC coil of the first embodiment will be described with reference to FIGS. 2A and 2B. FIG. 2A is a perspective view when the elliptical BC coil is viewed obliquely, and FIG. 2B is a diagram when the elliptical BC coil is viewed from one side of the central axis 201 direction.

The elliptical BC coil of the first embodiment is of a high pass type. As shown in FIGS. 2A and 3B, the elliptical BC coil of the first embodiment is configured to include: 4N (N is a natural number, N =3 in the diagrams) linear conductor elements 202 disposed in parallel with the central axis 201 along the elliptical cylindrical curved surface having a long axis diameter A and a short axis diameter B; two elliptical ring-shaped conductor elements 203a and 203b disposed along the elliptical cylindrical curved surface with a point on the central axis 201 as the center; 8N (N is a natural number) resonance capacitor elements 204 inserted in series in each of the two elliptical ring-shaped conductor elements 203a and 203b; first and second feed points 205a and 205b for connecting the elliptical BC coil to a high-frequency circuit; and a tuning mechanism (not shown in FIG. 2A) to be described later. The resonance capacitor element 204 is inserted between the connection points of the elliptical ring-shaped conductor element and the linear conductor element. In the first embodiment, the linear conductor element 202 and the elliptical ring-shaped conductor element 203 are formed as sheet-like conductors having a thickness of about tens to hundreds of micrometers. As a conductor sheet, a metal member having excellent electric conductivity, such as copper or aluminum, is used. In FIGS. 2A and 2B, the central axis 201 direction is a z axis, the long axis direction is an x axis, and the short axis direction is a y direction.

The two elliptical ring-shaped conductor elements 203a and 203b are disposed such that their loop surfaces are parallel to each other. That is, the two elliptical ring-shaped conductor elements 203a and 203b are disposed such that the loop surfaces are perpendicular to the central axis 201. In addition, both ends of each linear conductor element 202 are electrically connected to the elliptical ring-shaped conductor element 203 at connection points 206. In addition, since the elliptical ring-shaped conductor element is formed as a sheet-like conductor, the width direction of the sheet-like conductor is the central axis 201 direction, and the thickness direction of the sheet-like conductor is a direction perpendicular to the central axis 201. In addition, similar to the elliptical cylindrical curved surface, the long axis diameter and the short axis diameter of the elliptical ring-shaped conductor element 203 are A and B, and A>B. Preferably, a ratio A/B is equal to or greater than 1.1 and equal to or less than 1.5.

The "4N" linear conductor elements 202 are disposed so as to be axisymmetric with respect to the long axis (x axis) and the short axis (y axis) of the elliptical cylindrical curved surface. In the example shown in FIGS. 2A and 2B, four of the "4N" linear conductor elements are disposed so as to pass through an intersection between the long axis (x axis) and the short axis (y axis) of the elliptical cylindrical curved surface. The remaining "4(N−1)" linear conductor elements 202 are disposed at positions that are axisymmetric with respect to the long axis (x axis) and the short axis (y axis) of the elliptical cylindrical curved surface.

In the elliptical ring-shaped conductor element 203, a conductor portion having connection points, which are connected to the two adjacent linear conductor elements 202, as both ends is called an arc-shaped conductor. The resonance capacitor elements (Dn, En (n=1, 2, 3, . . . )) 204 having the same capacitance are inserted in each arc-shaped conductor. The capacitance is selected so that the elliptical BC coil resonates at a nuclear magnetic resonance frequency (fc). Here, as for the same capacitance, each capacitance may vary within the allowable range taking the manufacturing variations into consideration. In this sense, respective capacitances are substantially the same or approximately the same. In the first embodiment, the variation in the capacitance of the resonance capacitor element is allowable up to about 10%. The same capacitance is used in this sense hereinbelow. In this manner, by making all of the resonance capacitor elements 204 have the same capacitance, it is possible to reduce the effort and cost at the time of manufacturing. As a result, it is possible to reduce the variation in performance. In addition, the resonance capacitor element 204 may be formed by a plurality of capacitive elements. In this case, the combined capacitance of the plurality of capacitive elements is the capacitance of the resonance capacitor element 204.

The first and second feed points 205a and 205b are disposed at positions which are axisymmetric with respect to the long axis (x axis) or the short axis (y axis) and at which, when electric power is supplied to one of the feed points, the amplitude of the high-frequency current flowing through the other feed point is minimized. The feed points 205a and 205b are connected to both ends of the resonance capacitor element 204 through a Balun.

However, when the linear conductor elements 202 are disposed so as to be axisymmetric with respect to the long axis and the short axis of the elliptical cylindrical curved surface as described above, the inductance of the linear conductor element 202 and the inductance of the arc conductor become asymmetrical. Accordingly, in the same resonance capacitor element 204 disposed in the elliptical ring-shaped conductor element 203, it is difficult to make the elliptical BC coil resonate at the nuclear magnetic resonance frequency (fc). In the first embodiment, therefore, the inductances of the "4N" linear conductor elements 202 arrayed in parallel are changed stepwise in the circumferential direction of the elliptical cylindrical curved surface (that is, in the circumferential direction of the elliptical ring-shaped conductor 203). Specifically, a distance between the centers of the linear conductor elements 202 is increased toward the long axis direction from the short axis direction of the elliptical cylindrical curved surface (that is, toward the long axis direction from the short axis direction of the elliptical ring-shaped conductor 203).

As an example, when forming the linear conductor element 202 and the elliptical ring-shaped conductor element 203 as sheet-like conductors, the width of a central portion (rung portion) of the linear conductor element 202 in the circumferential direction of the elliptical cylindrical curved surface is increased toward the long axis direction from the short axis direction of the elliptical cylindrical curved surface. In addition, the width of the sheet-like conductor of the elliptical ring-shaped conductor element 203 in the central axis 201 direction is assumed to be approximately constant. As a result, the arrangement density of the linear conductor elements 202 in the circumferential direction of the elliptical cylindrical curved surface is high in the short axis of the elliptical cylindrical curved surface, and decreases toward the long axis direction from the short axis direction. This balances out the asymmetry of the inductance of the linear conductor element 202 and the inductance of the arc-shaped conductor due to the elliptical cylindrical shape. Therefore, even if the plurality of resonance capacitor elements 204 (Dn, En (n=1, 2, 3, . . . )) inserted in series in the elliptical ring-shaped conductor element 203 have the same capacitance value, it is possible to set the nuclear magnetic resonance frequency (fc) as a resonance frequency of the elliptical BC coil.

Figure 3:
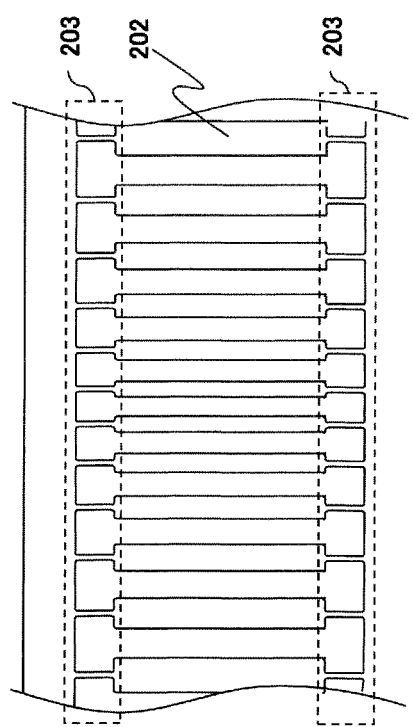
FIG. 3 is a developed diagram obtained by cutting an example of the elliptical BC coil of the first embodiment in parallel with the central axis 201 and expanding the result to the left and right.

FIG. 3 is a developed diagram obtained by cutting an example of the elliptical BC coil of the first embodiment in parallel with the central axis 201 and expanding the result to the left and right. Here, a tuning mechanism, which will be described later, is not shown. The left and right direction in FIG. 3 corresponds to the circumferential direction.

The width of the central portion of each linear conductor element 202 in the circumferential direction (left and right direction in the developed diagram of FIG. 3) is different. Accordingly, the arrangement interval or the arrangement density of the linear conductor elements 202 in the circumferential direction is different. Since the arrangement density of the linear conductor elements in the short axis direction of the elliptical annular curved surface is high as described above, a central portion in FIG. 3 corresponds to the short axis direction.

Each linear conductor element 202 has a central portion (rung portion) having a fixed width and wide portions which are located at both ends and whose widths in the circumferential direction are larger than the width of the rung portion. In addition, each linear conductor element 202 is disposed such that a gap is formed between the wide portions of the adjacent linear conductor elements 202. The resonance capacitor element 204 is disposed in a gap between the wide portions, and adjacent wide portions are electrically connected (soldered) to each other through the resonance capacitor element 204. That is, since both of the ends (wide portions) of the linear conductor element 202 are electrically connected to each other through the resonance capacitor element 204, the elliptical ring-shaped conductor element 203 is formed at both of the ends (wide portions). In addition, since the plurality of linear conductor elements 202 are electrically connected to each other at both ends thereof through the resonance capacitor element 204, an elliptical BC coil is formed. In addition, as described above, since the distance between the centers of the linear conductor elements 202 is increased toward the long axis direction from the short axis direction of the elliptical cylindrical curved surface, the arrangement interval of each resonance capacitor element 204 disposed in a gap is increased toward the long axis direction from the short axis direction of the elliptical cylindrical curved surface (that is, toward the long axis direction from the short axis direction of the elliptical ring-shaped conductor element 203).

(Description of a Tuning Mechanism)

Next, a tuning mechanism of the elliptical BC coif of the first embodiment will be described.

In order to tune the elliptical BC coil, that is, in order to match the resonance frequency of the elliptical BC coil with the nuclear magnetic resonance frequency (fc), the capacitances of the resonance capacitor elements 204 [Dn, En (n=1, 2, 3, . . . )] inserted in series in the elliptical ring-shaped conductor element 203 are adjusted. Since the capacitances of the resonance capacitor elements 204 are the same, substantially the same capacitance changes are collectively performed for the resonance capacitor elements 204. In order to realize this, as shown in FIG. 2B, an adjustment belt 251 and the elliptical ring-shaped conductor element 203 are disposed so as to face each other with a dielectric sheet (an example of a dielectric member) 261, which also serves as an insulating sheet, interposed therebetween, so that the sliding movement of the adjustment belt 251 relative to the elliptical ring-shaped conductor element 203 can be manually performed in the circumferential direction of the elliptical annular curved surface, that is, the rotational movement of the adjustment belt 251 relative to the elliptical ring-shaped conductor element can be manually performed concentrically.

In this manner, it is possible to perform well-balanced tuning of the elliptical BC coil as viewed from the first and second feed points 205a and 205b. In addition, a tuning mechanism may be disposed in one of the two elliptical ring-shaped conductor elements 203a and 203b (203a in FIG. 2A). However, it is also possible to dispose the tuning mechanism in each of both the elliptical ring-shaped conductor elements 203a and 203b.

As shown in FIG. 4, the adjustment belt 251 has a belt shape, and is formed by arranging a conductor piece 402 and a slit portion 403, which insulates the adjacent conductor pieces 402 from each other, alternately. Each conductor piece 402 is disposed on the inner side of the adjustment belt 251 near a position facing the resonance capacitor element 251 in a state where the adjustment belt 251 is disposed on the outer periphery of the elliptical ring-shaped conductor element 203. Thus, as an example of forming the adjustment belt 251, the adjustment belt 251 is formed by bonding the conductor pieces 402 on the surface of a belt-shaped insulating member (substrate material) 401 facing the elliptical ring-shaped conductor element 203 intermittently in the longitudinal direction of the belt-shaped insulating member 401 (that is, in the circumferential direction of the elliptical annular curved surface). In this case, a portion of the belt-shaped insulating member 401 having no conductor piece 402 is the slit portion 403.

Each conductor piece 402 has a sheet shape, and is disposed at positron covering the resonance capacitor element 204 in the longitudinal direction of the belt-shaped insulating member 401, that position being a position facing the resonance capacitor element 204 inserted in the elliptical ring-shaped conductor element 203. The conductor piece 402 is for forming a stray capacitance between each of both sides of the facing resonance capacitor element 204 and a conductor portion of the elliptical ring-shaped conductor element 203. In addition, the stray capacitance is changed by sliding the adjustment belt 251 in the circumferential direction of the elliptical ring-shaped conductor element 203 or rotating the adjustment belt 251 concentrically with the elliptical ring-shaped conductor element 203.

This stray capacitance can be regarded as a capacitive element disposed in parallel with the resonance capacitor element 204. In addition, when viewed from both ends of the resonance capacitor element 204, the combined capacitance of the capacitance of the resonance capacitor element and the stray capacitance is the apparent capacitance of the resonance capacitor element. That is, the apparent capacitance of a resonance capacitor element is a combined capacitance of the capacitance of the resonance capacitor element and a stray capacitance that is formed between the conductor piece 402 and a conductor portion of a ring-shaped conductor element.

Therefore, since the apparent capacitance of the resonance capacitor element, which is a combined capacitance, can be changed through a change in the stray capacitance by sliding the adjustment belt 251, the capacitance of the resonance capacitor element 204 can be changed (that is, adjusted) in an equivalent manner. As a result, since the apparent capacitances of a plurality of resonance capacitor elements can be changed collectively in a balanced manner by sliding the adjustment belt 251 in the circumferential direction of the ring-shaped conductor element 203, it is possible to change (tune) the resonance frequency of the elliptical BC coil.

The width of the conductor piece 402 in the central axis 201 direction may be determined on the basis of the adjustable range of the capacitance of the resonance capacitor element 204, and may be substantially the same as the width of the elliptical ring-shaped conductor element 203. For example, the width of the conductor piece 402 in the central axis 201 direction can be set to about 20 mm to 80 mm. The thickness of the conductor piece 402 in a direction perpendicular to the circumferential direction of the elliptical annular curved surface may be a thickness allowing flexibility so as to be able to maintain a sheet-like shape. For example, good conductor metal (for example, copper or aluminum) having a thickness of about 0.01 mm to 0.1 mm can be used.

It is preferable that the width of the belt-shaped insulating member 401 in the central axis 201 direction be equal to or greater than the width of the conductor piece 402 in the same direction, and the thickness of the belt-shaped insulating member 401 in a direction perpendicular to the circumferential direction of the elliptical annular curved surface may be a thickness allowing flexibility so as to be able to maintain a sheet-like shape. For example, a glass epoxy sheet having a thickness of about 0.1 mm to 0.5 mm can be used.

In order to insulate the adjustment belt 251 and the elliptical ring-shaped conductor element 203 from each other, the width of the dielectric sheet 261 in the central axis 201 direction is made to be larger than the width of the conductor piece 402. The thickness in a direction perpendicular to the circumferential direction of the elliptical annular curved surface can be set to about 0.1 mm to 0.5 mm. As a material, a fluorine resin sheet with little dielectric loss or the like can be used.

(Shape of a Conductor Piece)

FIG. 5 shows an example of the shape of the conductor piece 402. The conductor piece 402 is formed by arranging two stray capacitance forming portions 502a and 502b, which are for forming a stray capacitance with a conductor portion of the elliptical ring-shaped conductor element 203, so as to face each other with a gap (cut) portion 504 interposed therebetween and forming a connecting conductor portion 503, which electrically connects the two stray capacitance forming portions 502a and 502b to each other, on a conductor sheet. As a whole, the conductor piece 402 has a shape having protruding portions 502a and 502b in the same direction at both ends of the connecting conductor portion 503. From another perspective, it can also be said that the conductor piece 402 has a shape in which the gap portion 504 is formed on one side of the central portion in an approximately rectangular shape. There is no conductor in the gap portion 504.

The gap portion 504 is formed so as to face the resonance capacitor element 204 disposed in the elliptical ring-shaped conductor element 203. The reason for providing the gap portion 504 in this manner is that eddy current generated in the conductor piece 402 due to the application of the gradient magnetic field is suppressed by blocking the path along which the eddy current flows. In addition, the stray capacitance forming portions 502a and 502b of the conductor piece 402 equivalently overlap the conductor portion of the elliptical ring-shaped conductor element 203. Therefore, even if a maximum voltage is generated between the stray capacitance forming portions 502a and 502b and the conductor portion of the elliptical ring-shaped conductor element 203, the risk of discharge via the conductor piece 402 is reduced between conductor portions of the elliptical ring-shaped conductor elements 203 on both sides of the resonance capacitor element 204 interposed therebetween.

In addition, if the generation of eddy current does not cause any problem and there is no need to suppress the discharge risk, the shape of the conductor piece 402 may be a square, a rectangle, a polygon, and a circle, or an ellipse with no gap portion 504.

Lengths 511a and 511b of the stray capacitance forming portions 502a and 502b in the circumferential direction of the adjustment belt 251 and a length 512 of each of the stray capacitance forming portions 502a and 502b in the width direction of the adjustment belt 251 are determined on the basis of the adjustable range of the capacitance of the resonance capacitor element 204.

Since the connecting conductor portion 503 is a conductor for electrically connecting the stray capacitance forming portions 502a and 502b to each other, a length 513 of the connecting conductor portion 503 in the width direction of the adjustment belt 251 can be arbitrarily increased or decreased in a range where the mechanical stability can be maintained.

(Structure of a Tuning Mechanism)

The structure of the tuning mechanism will be described with reference to FIGS. 6A, 6B, 6C and 7.

FIG. 6A is a developed diagram obtained by cutting an elliptical BC coil with a tuning mechanism in parallel with the central axis 201 and expanding the result to the left and right. The left and right direction in FIG. 6A corresponds to the circumferential direction. FIG. 6A(a) shows a case where the arrangement position of the adjustment belt 251 is set in a positional relationship in which the gap portion 504 of each conductor piece 402 of the adjustment belt 251 is disposed at a position where each resonance capacitor element 204 is disposed. FIG. 6A(b) shows a case where the gap portion 504 of each conductor piece 402 is shifted to the right with respect to a gap between the linear conductor elements 202 by sliding the adjustment belt 251 from the state of FIG. 6A(a) to the right (that is, in the circumferential direction) in the diagram.

Although the dielectric sheet 261 (not shown) is disposed between the elliptical ring-shaped conductor element 203 and the adjustment belt, the dielectric sheet 261 may be fixed to the elliptical ring-shaped conductor element 203 side with adhesive or screws so as to cover the wide portion of the linear conductor element 202 that also serves as the elliptical ring-shaped conductor element 203. Alternatively, the adjustment belt 251 and the dielectric sheet 261 may be integrally formed by combining them physically with screws etc. In this case, the adjustment belt 251 and the dielectric sheet 261 slide integrally and are screwed.

The adjustment belt 251 is slidably disposed on the outer periphery of the dielectric sheet 261. In addition, a guide groove that houses the elliptical ring-shaped conductor element 203, the dielectric sheet 261, and the adjustment belt 251 and guides the sliding movement of the adjustment belt is provided on a bobbin for housing an electrical circuit portion of the elliptical BC coil.

Figure 6B:
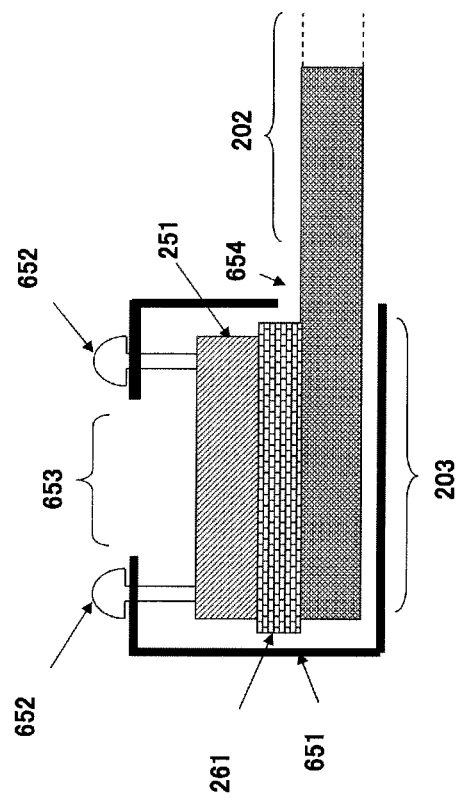
FIG. 6B is a cross-sectional view of a guide groove 651 provided at the bobbin end of the elliptical BC coil of the first embodiment, and is a diagram showing an example of the structure for fixing the adjustment belt.

FIG. 6B shows an example of a guide groove provided on a bobbin. FIG. 6B shows a cross-sectional view of a guide groove 651 provided at the bobbin end of the elliptical BC coil. A bottom side of the guide groove 651 is the central axis 201 side, and a direction perpendicular to this cross-section (direction perpendicular to the paper surface) is the circumferential direction. In the guide groove 651 which has an outer frame cross-section of a rectangular shape having a narrow opening 653 on the top side and in which the inside of the outer frame is vacant, the elliptical ring-shaped conductor element 203, the dielectric sheet 261, and the adjustment belt 251 are housed in the guide groove 651 from the bottom side (central axis 201 side) so as to form three layers. Since the elliptical ring-shaped conductor element 203 is formed integrally with the linear conductor element 202, a through hole 654 through which the linear conductor element 202 passes is formed on the side surface of the guide groove on the linear conductor element 202 side. In addition, the elliptical BC coil is tuned by manually sliding the adjustment belt 251 in the circumferential direction of the elliptical ring-shaped conductor element 203 through the opening 653. After determining the position of the adjustment belt 251, the adjustment belt 251 is fixed by pressing the outer frame with a screw 652.

Figure 6C:
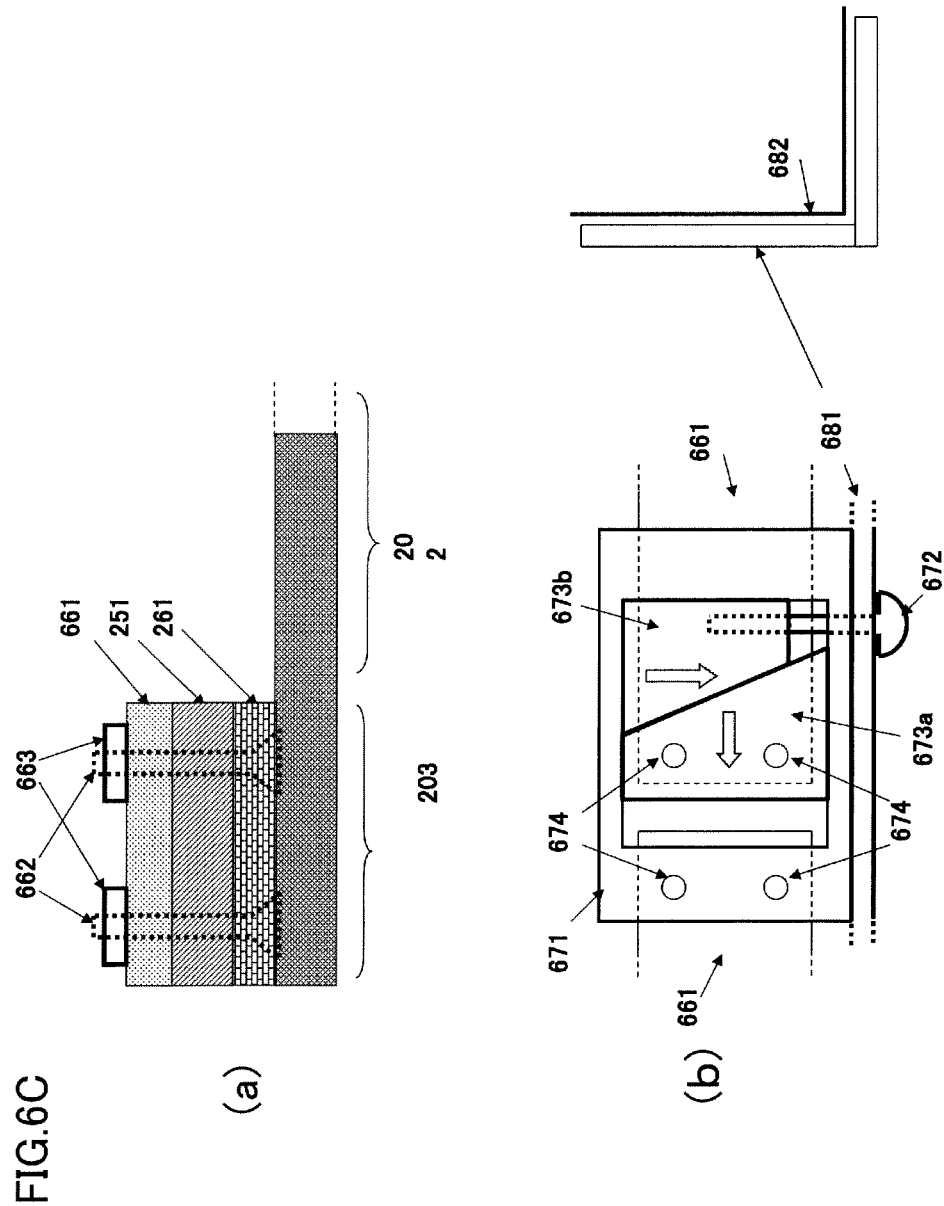
FIG. 6C is a diagram showing another example of the mechanism that is provided at the bobbin end of the elliptical BC coil of the first embodiment in order to fix the position of the adjustment belt 251, where (a) shows a cross-sectional view of an integrated structure of a fixing belt 661, an adjustment belt 251, and a dielectric sheet 261 and (b) shows an example of a fastener to change the effective circumference of the fixing belt 661.

In addition, FIG. 6C shows another example of the mechanism for fixing the position of the adjustment belt 251. In the example shown in FIG. 6C, a fixing belt 661 is disposed on the outer periphery of the adjustment belt 251, and the effective circumference of the fixing belt 661 is changed so that the adjustment belt 251 is loosened or fixed by being tightened so as to be pressed against the elliptical ring-shaped conductor element 203. In order to realize this, the fixing belt 661, the adjustment belt 251, and the dielectric sheet 261 are integrated. In addition, these are slid integrally in the circumferential direction. Here, the effective circumference of the fixing belt 661 is a combined circumference of a distance between both ends of the fixing belt 661 and the circumference of the fixing belt 661, and the effective circumference of the fixing belt 661 is changed by increasing or decreasing the distance between both ends of the fixing belt 661.

Specifically, as shown in FIG. 6C(a), the fixing belt 661, the adjustment belt 251, and the dielectric sheet 261 are integrated by making a countersunk screw 662 pass through the fixing belt 661, the adjustment belt 251, and the dielectric sheet 261 and tightening the countersunk screw 662 with a hexagon nut 663. FIG. 6C(a) shows a cross-sectional view of the integrated structure. The fixing belt 661 is formed of polycarbonate having a thickness of 1 mm to 3 mm.

FIG. 6C(b) shows an example of a fastener that changes the effective circumference of the fixing belt 661 by connecting both ends of the fixing belt 661 to each other to change the distance between both of the ends. The left diagram of FIG. 6C(b) shows a front view when a fastener is viewed from the top, and the right diagram shows a part of a bobbin 682 end and a structure reinforcing rib 681, which is disposed at the end, of an elliptical BC coil. The fastener shown in FIG. 6C(b) mainly includes a fastener frame 671, a fixture 673a, a tension generator 673b, and a tightening adjustment screw 672, and both ends of the fixing belt 661 are connected to the fastener so that the effective circumference of the fixing belt is changed.

One end of the fixing belt 661 is fixed to one end of the fastener frame 671 in the longitudinal direction with a screw 674. In addition, the fastener frame 671 is disposed such that one end of the fastener frame 671 in the lateral direction is in contact with the rib 681 of the bobbin 682 of the elliptical BC coil.

In the fastener frame 671, the fixture 673a and the tension generator 673b each having a trapezoidal shape are disposed. The fixture 673a is a part to which the other end of the fixing belt 661 is fixed with the screw 674 and which is disposed so as to be slidable in the longitudinal direction with respect to the fastener frame 671. In addition, the tension generator 673b is a part that is disposed between the other end of the fastener frame 671 in the longitudinal direction and the fixture 673a and that is disposed along the other end of the fastener frame 671 in the longitudinal direction so as to be slidable in the lateral direction. Trapezoidal slopes of the fixture 673a and the tension generator 673b are in contact with each other so as to be slidable.

The tightening adjustment screw 672 passes through the rib 681 and the fastener frame 671 and is screwed inside the tension generator 673b. In the rib 681, a screw hole (not shown) that is long in the circumferential direction is provided. The fastener is moved in the circumferential direction by moving the tightening adjustment screw 672 in the circumferential direction in the screw hole that is long in the circumferential direction. With the movement of the fastener in the circumferential direction, the fixing belt 661, the adjustment belt 251, and the dielectric sheet 261 slide integrally in the circumferential direction. Accordingly, the apparent capacitance adjustment of the resonance capacitor element 204 is performed by moving the tightening adjustment screw 672 in the circumferential direction within the range of the screw hole provided in the rib 681.

By rotating the tightening adjustment screw 672, the tension generator 673b slides in the lateral direction of the fastener frame 671. The fixture 673a slides in the longitudinal direction of the fastener frame 671 according to the sliding movement of the tension generator 673b, and the effective circumference of the fixing belt 661 is changed according to the sliding movement of the fixture 673a in the longitudinal direction of the fastener frame 671. Specifically, when the tension generator 673b is slid so as to be pulled to the tightening adjustment screw 672 side by rotating the tightening adjustment screw 672 in one direction, the fixture 673a slides to one end side of the fastener frame 671 in the longitudinal direction. Then, the distance between both ends of the fixing belt 661 is reduced, and the effective circumference is shortened. As a result, the adjustment belt 251 is fixed by being pressed against the elliptical ring-shaped conductor element 203 by the fixing belt 661. Alternatively, when the tension generator 673b is slid so as to be away from the tightening adjustment screw 672 side by rotating the tightening adjustment screw 672 in the opposite direction, the fixture 673a slides to the tension generator 673b side. Then, the distance between both ends of the fixing belt 661 is increased, and the effective circumference is increased. As a result, since the fixing belt 661 and the adjustment belt 251 are loosened in the circumferential direction, the integral sliding movement of the fixing belt 661 and the adjustment belt 251 becomes possible.

In addition, fixation of the adjustment belt 251 by the fixing belt 661 can also be applied to a cylindrical BC coil in a third embodiment to be described later. That is, a fixing belt is further disposed on the outer periphery of an adjustment belt disposed on the outer periphery of an arbitrary ring-shaped conductor element which may be elliptical or circular, and the adjustment belt is fixed by being tightened so as to be pressed against the ring-shaped conductor element by the fixing belt. In order to realize this, a fastener that connects both ends of a fixing belt to each other to change the effective circumference of the fixing belt is provided.

Figure 7:
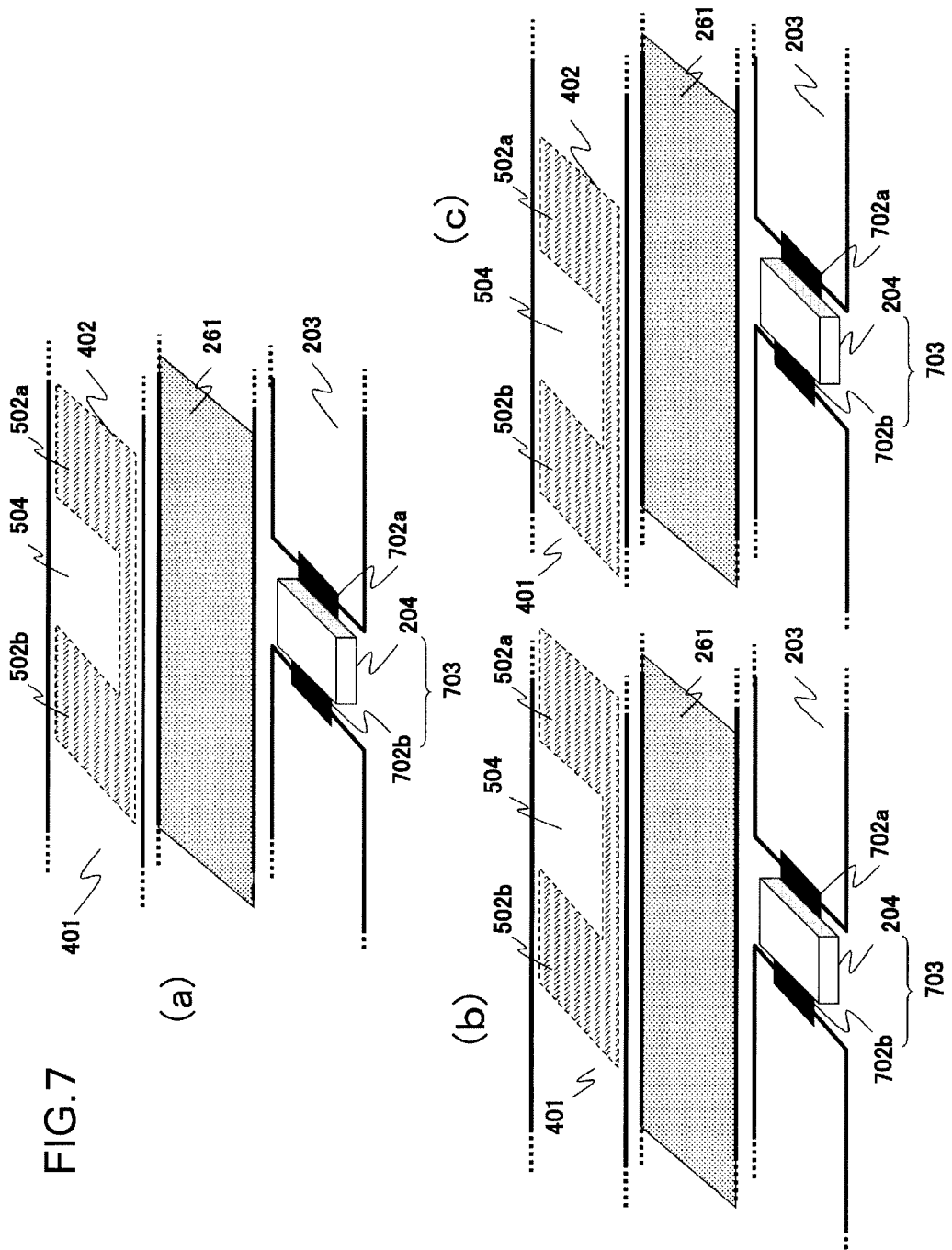
FIG. 7 is an enlarged view of a part of a three-layer structure including resonance capacitor elements inserted in series in an elliptical ring-shaped conductor element, a dielectric sheet, and an adjustment belt facing each resonance capacitor element with the dielectric sheet interposed therebetween.

In addition, FIG. 7 shows an enlarged view of a part of a three-layer structure including the resonance capacitor element 204 inserted in series in the elliptical ring-shaped conductor element 203, the dielectric sheet 261, and the adjustment belt 251 facing the resonance capacitor element 204 with the dielectric sheet 261 interposed therebetween. In addition, although all of the above components are curved along the elliptical annular curved surface, they are shown in flat shapes in FIG. 7 so as to be easily understood. In addition, a distance between the respective layers is also expanded.

As described above, the elliptical ring-shaped conductor element 203 is formed by the wide portion of the linear conductor element 202, the resonance capacitor element 204 is disposed in a gap between adjacent wide portions (that is, in a separation portion 703 of the elliptical ring-shaped conductor element 203), and the elliptical ring-shaped conductor element 203 is electrically connected (that is, soldered 702a and 702b) to the adjacent wide portions at both ends of the resonance capacitor element 204. FIG. 7(a) shows a case where the adjustment belt 251 is disposed such that the conductor piece 402 and the gap portion 504 are symmetrical with respect to the resonance capacitor element 204 in the longitudinal direction of the elliptical ring-shaped conductor element 203, FIG. 7(b) shows a case where the adjustment belt 251 slides to the right side from the state of FIG. 7(a), and FIG. 7(c) shows a case where the adjustment belt 251 slides to the left side from the state of FIG. 7(a). As a whole, a configuration is obtained in which the three-layer structure shown in FIG. 7 is repeated in the longitudinal direction of the elliptical ring-shaped conductor element 203 (that is, in the circumferential direction).

In the three-layer arrangement described above, a stray capacitance is formed between the stray capacitance forming portion 502 of the conductor piece 402 and a conductor portion of the elliptical ring-shaped conductor element 203. However, since a conductor is hardly present in the separation portion 703, no stray capacitance is formed between the stray capacitance forming portion 502 and the separation portion 703. Accordingly, it is possible to change the stray capacitance formed between the stray capacitance forming portion 502 and the elliptical ring-shaped conductor element 203 by changing the overlapping area of the stray capacitance forming portion 502 and both the conductor portion of the elliptical ring-shaped conductor element 203 and the separation portion 703.

As shown in FIG. 7(a), in the arrangement in which the conductor piece 402 and the gap portion 504 are symmetrical with respect to the separation portion 703 or the resonance capacitor element 204 in the longitudinal direction of the adjustment belt 251 that is, in the arrangement in which the gap portion 504 is located immediately above the separation portion 703 or the resonance capacitor element 204 in the diagram), since the total area of each of the stray capacitance forming portions 502a and 502b overlaps the conductor portion of the elliptical ring-shaped conductor element 203, both of the stray capacitances formed are maximized.

Therefore, as shown in FIG. 7(b), when the adjustment belt 251 is slid to the right side, the overlapping area of the stray capacitance forming portion 502a of the conductor piece 402 and the conductor portion of the elliptical ring-shaped conductor element 203 is not changed from that in the case of (a), but the overlapping area of the stray capacitance forming portion 502b of the conductor piece 402 and the conductor portion of the elliptical ring-shaped conductor element 203 becomes smaller than that in the case of (a).

Alternatively, as shown in FIG. 7(c), when the adjustment belt 251 is slid to the left side, the overlapping area of the stray capacitance forming portion 502b of the conductor piece 402 and the conductor portion of the elliptical ring-shaped conductor element 203 is not changed from that in the case of (a), but the overlapping area of the stray capacitance forming portion 502a of the conductor piece 402 and the conductor portion of the elliptical ring-shaped conductor element 203 becomes smaller than that in the case of (a).

By forming the tuning mechanism as described above and sliding the adjustment belt 251 in the longitudinal direction (that is, in the circumferential direction) from the state where the gap portion 504 of the conductor piece 402 is disposed so as to cover the separation portion 703 or the resonance capacitor element 204, the gap portion 504 of the conductor piece 402 and the stray capacitance forming portion 502 move relatively to the separation portion 703 and the conductor portion of the elliptical ring-shaped conductor element 203. As a result, since the overlapping area of the stray capacitance forming portion 502 and the conductor portion of the elliptical ring-shaped conductor element 203 changes according to the amount of sliding movement, the stray capacitance formed between the stray capacitance forming portion 502 and the conductor portion of the elliptical ring-shaped conductor element 203 changes. Since the resonance frequency of the elliptical BC coil is determined by the stray capacitance and the resonance capacitor element 204, the resonance frequency of the elliptical BC coil can be changed by changing the stray capacitance using the tuning mechanism. Thus, the resonance frequency of the elliptical BC coil can be adjusted so as to match the nuclear magnetic resonance frequency (fc).

(Equivalent Circuit)

Next, a function of the conductor piece 402 will be described using an equivalent circuit 800 combined with the resonance capacitor element 204 shown in FIG. 8(a). As for the relationship between each lumped constant and each element of the tuning mechanism in the equivalent circuit 800, the resonance capacitor element 204 corresponds to a capacitor (C) 801, the stray capacitance forming portion 502a of the conductor piece 402 corresponds to a capacitor (Ca) 802a, the stray capacitance forming portion 502b of the conductor piece 402 corresponds to a capacitor (Cb) 802b, and the connecting conductor portion 503 of the conductor piece 402 corresponds to an inductance (Lf) 803. In addition, since the connecting conductor portion 503 is not changed even if the adjustment belt 251 slides, the inductance (Lf) is constant.

In addition, FIG. 8(b) is a graph showing various changes according to the sliding movement of the adjustment belt 251. The vertical axis indicates a relative value of each value, and the horizontal axis indicates a relative position of the adjustment belt. The middle of the horizontal axis shows a case where the gap portion 504 becomes an opposite position of the separation portion 703, the left side (origin side) of the horizontal axis corresponds to a case where the adjustment belt has slid to the left side in the longitudinal direction, and the right side of the horizontal axis corresponds to a case where the adjustment belt has slid to the right side in the longitudinal direction. As described above, the capacitance of Ca increases gradually as the gap portion 504 becomes close to the separation portion 703 by sliding the adjustment belt 251 to the right side, and becomes a maximum value when the gap portion 504 is located near the opposite position of the separation portion 703. Then, the maximum value is maintained. The state is shown by a one-dot chain line graph 851 in FIG. 8(b). On the other hand, the capacitance of Cb maintains a maximum value until the gap portion 504 becomes close to the separation portion 703 by sliding the adjustment belt 251 to the right side, and decreases gradually after the gap portion 504 is located near the opposite position of the separation portion 703. The state is shown by a dotted line graph 852 in FIG. 8(b).

A combined capacitance Ccmb of the equivalent circuit 800 when the inductance (Lf) 803 can be regarded as zero (0) is as follows.

$$Ccmb = C + CaCb/\{Ca+Cb\} \qquad [1]$$

The second term (CaCb/{Ca+Cb}) in Expression [1] increases gradually as the gap portion 504 becomes close to the separation portion 703 by sliding the adjustment belt 251 to the right side, and becomes a maximum value when the gap portion 504 is located near the opposite position of the separation portion 703. Then, the second term(CaCb/{Ca+Cb}) decreases gradually. The state is shown by a two-dot chain line graph 853 in FIG. 8(b).

The resonance frequency (fr) when a resonance capacitor element having the combined capacitance (Ccmb) resonates with the inductance connected in series is as follows.

$$fr \propto 1/SQRT(Ccmb) \quad [2]$$

The state is shown by a solid line graph 854 in FIG. 8(*b*). From FIG. 8(*b*), it is understood that the resonance frequency is changed by sliding the adjustment belt 251. That is, it is understood that the resonance frequency of the elliptical BC coil can be changed by sliding the adjustment belt 251 to the left and right in the circumferential direction and accordingly the resonance frequency of the elliptical BC coil can be tuned so as to match the nuclear magnetic resonance frequency (fc).

(Tuning Procedure)

Next, the tuning procedure of the elliptical BC coil using the above tuning mechanism will be described with reference to the flow chart shown in FIG. 9.

In step 901, an operator places an elliptical BC coil in the static magnetic field space of the static magnetic field generation system, and further places a model phantom therein. Then, an impedance analyzer is connected to the first and second feed points 205a and 205b of the elliptical BC coil.

In step 902, the operator places the adjustment belt 251 at a predetermined initial position. For example, the adjustment belt is placed at the middle position of the range where the resonance frequency can be adjusted. Specifically, the gap portion 504 of the conductor piece 402 is placed at a position slid about ¼ from the separation portion 703 (for example, placed at a position of 855 in FIG. 8(*b*)).

In step 903, the operator measures the frequency (fr) at which an $S_{11}$ value (reflection loss; return loss) is minimized using the impedance analyzer.

In step 904, the process proceeds to step 905 when the frequency (fr) measured in step 902 is higher than the nuclear magnetic resonance frequency (fc), and proceeds to step 906 when the frequency (fr) measured in step 902 is lower than the nuclear magnetic resonance frequency (fc). If the frequency (fr) measured in step 902 is equal to the nuclear magnetic resonance frequency (fc), the tuning process ends to proceed to step 907.

In step 905, the operator slides the adjustment belt 251 so that the frequency (fr), at which the $S_{11}$ value measured by the impedance analyzer is minimized, becomes low. For example, the adjustment belt 251 is slid in the circumferential direction so that the gap portion 504 of the conductor piece 402 becomes close to the separation portion 703 side. Then, the process proceeds to step 903.

In step 906, the operator slides the adjustment belt 251 so that the frequency (fr), at which the $S_{11}$ value measured by the impedance analyzer is minimized, becomes high. For example, the adjustment belt 251 is slid in the circumferential direction so that the gap portion 504 of the conductor piece 402 becomes away from the separation portion 703 side. Then, the process proceeds to step 903.

In step 907, the operator fixes the adjustment belt 251 by tightening the screw 652 of the guide groove 651 of the adjustment belt.

The above is the explanation of the tuning procedure of the elliptical BC coil.

In addition, in the above explanation, the case where the number of linear conductor elements is 4m (m=1, 2, 3, . . . ) has been described. However, in order to improve the orthogonality between the feed ports 205a and 205b, it is also possible to use an elliptical BC coil having (4m+2) linear conductor elements by increasing two linear conductor elements. When the number of linear conductor elements is "4m+2", the number of linear conductor elements and the number of resonance capacitor elements are simply increased compared with a case when the number of linear conductor elements is "4m", and others are the same as a case when the number of linear conductor elements is "4m".

As described above, in the BC coil and the MRI apparatus using the same of the first embodiment, an elliptical BC coil having an elliptical cylindrical shape is used as the BC coil, and an adjustment belt is slidably disposed on the outer periphery of the elliptical ring-shaped conductor element with a dielectric sheet interposed therebetween. A plurality of conductor pieces are disposed in the adjustment belt so as to cover resonance capacitor elements inserted in series in the elliptical ring-shaped conductor element. Then, the adjustment belt is slid in the circumferential direction (longitudinal direction of the adjustment belt). In this manner, adjustments to change the apparent capacitances (that is, a combined capacitance according to the combination with the stray capacitance) of a plurality of resonance capacitor elements inserted in series in the elliptical ring-shaped conductor element can be collectively performed in a balanced manner. As a result, since the resonance frequency of the elliptical BC coil can be easily changed, the resonance frequency of the elliptical BC coil can be tuned so as to match the nuclear magnetic resonance frequency.

<<Second Embodiment>>

A second embodiment of the BC coil and the MRI apparatus using the same of the present invention will be described. In the first embodiment described above, an example has been given which the adjustment belt is slid along the circumferential direction of the elliptical ring-shaped element. In the second embodiment, however, the elliptical BC coil is tuned by sliding the adjustment belt in the central axis direction of the ring-shaped conductor element. Hereinafter, the second embodiment will be described in detail.

First, a tuning mechanism of the second embodiment will be described with reference to FIG. 10A. FIG. 10A shows an enlarged view when the arbitrary resonance capacitor element 204 and a conductor portion near the resonance capacitor element 204 in the elliptical ring-shaped conductor element 203 and the conductor piece 402 of the adjustment belt 251, which is present at a position facing the resonance capacitor element 204, are viewed from a direction perpendicular to the elliptical cylindrical curved surface. In addition, the dielectric sheet 261 and the belt-shaped insulating member 401 of the adjustment belt 251 are omitted.

By moving the adjustment belt 251 in the central axis 201 direction of the ring-shaped conductor element (that is, the elliptical cylindrical curved surface), the overlapping area of each of the stray capacitance forming portions 502a and 502b of the conductor piece 402 and the conductor portion of the elliptical ring-shaped conductor element 203 is changed, and the stray capacitance is also changed according to the area change. Specifically, in the arrangement relationship shown in FIG. 10A, when the adjustment belt 251 is pushed in the central axis 201 direction of the elliptical BC coil, the overlapping area of each of the stray capacitance forming portions 502a and 502b of the conductor piece 402 and the conductor portion of the elliptical ring-shaped conductor element 203 is increased and accordingly the stray capacitance is also increased. On the contrary, when the conductor piece 402 is pulled out in the central direction of the elliptical BC coil, the overlapping area of each of the stray capacitance forming portions 502a and 502b and the conductor portion of the elliptical ring-shaped conductor element 203 is reduced and accordingly the stray capacitance is also reduced.

FIG. 10B(a) shows an example of a guide groove that houses the elliptical ring-shaped conductor element 203, the dielectric sheet 261, and the adjustment belt 251 and guides the sliding movement of the adjustment belt 251 in the central axis 201 direction and that is provided on a bobbin for housing an electrical circuit of the elliptical BC coil in the second embodiment.

FIG. 10B(a) shows a cross-sectional view of a guide groove 1001 provided at the bobbin end of the elliptical BC coil of the second embodiment. Basically, the guide groove 1001 has the same structure as the guide groove 651 shown in FIG. 6B described in the first embodiment. However, the widths of the guide groove 1001 and its opening 1003 in the central axis direction are increased so that the adjustment belt 251 can slide in the central axis 201 direction. In addition, a support 1002 that supports a portion of the adjustment belt 251 pulled out in the central axis 201 direction is provided inside the guide groove 1001.

In addition, a through hole 1005 through which the linear conductor element 202 passes is formed on the side surface of the guide groove on the linear conductor element 202 side. In addition, the elliptical BC coil is tuned by manually sliding the adjustment belt 251 in the central axis 201 direction through the opening 1003. After determining the position of the adjustment belt 251, the adjustment belt 251 is fixed by pressing from the outer frame with a screw 1004. A plurality of screw holes of the bobbin 682 into which the screw 1004 is inserted are provided. The positions of the screw hales are selected corresponding to the position of the adjustment belt 251 slid in the central axis 201 direction, thereby performing screwing.

In addition, FIG. 10B(b) shows another example of the mechanism for fixing the position of the adjustment belt. The example shown in FIG. 10B(b) is an example when the structure example shown in FIG. 6C(b) described previously is applied to the second embodiment. In order to make the fixing belt 661, the adjustment belt 251, and the dielectric sheet 261 slide integrally in the central axis 201 direction, adjustment screws 1001a and 1001b for adjusting the position of the fastener in the central axis 201 direction are disposed at both ends of the fastener frame 671. Specifically, the fastener frame 671 is brought close to or away from the rib 681 side by inserting the adjustment screws 1001a and 1001b into both ends of the fastener frame 671 through the through holes of the rib 681 and rotating both of the adjustment screws 1001a and 1001b in the same direction, thereby moving the fastener in the central axis 201 direction. The fixing belt 661, the adjustment belt 251, and the dielectric sheet 261 slide integrally in the central axis 201 direction with the movement of the fastener in the central axis 201 direction. In addition, after determining the position of the adjustment belt 251 in the central axis direction, the adjustment belt 251 is fixed by rotating the tightening adjustment screw 672. Since the tightening fixing structure is the same as the structure example shown in FIG. 6C(b) described previously, detailed explanation thereof will be omitted. In addition. in the tightening adjustment screw 672 in the second embodiment, the neck length is increased so that the possible range of the fastener in the central axis 201 direction is covered.

An equivalent circuit in the second embodiment is the same as that shown in FIG. 8(a) described in the first embodiment. In particular, as shown in FIG. 10A, the stray capacitance forming portions 502a and 502b of the conductor piece 402 are symmetrical with respect to the separation portion 703. Accordingly, in the case of the arrangement in which the gap portion 504 overlaps the separation portion 703, the overlapping areas of the stray capacitance forming portion 502a and 502b and the conductor portion of the elliptical ring-shaped conductor element 203 are equal to each other without depending on the amount of movement of the conductor piece 402 in the central axis 201 direction. For this reason, the stray capacitances Ca and Cb are equal. FIG. 11(a) shows an equivalent circuit in this case. Both stray capacitances 1101a and 1101b are set to Cf. Others are the same as in FIG. 8(a).

As a result, the combined capacitance of the equivalent circuit when the inductance (Lf) 803 can be regarded as zero (0) is as follows.

$$Ccmb = C + Cf/2 \qquad [3]$$

The resonance frequency (fr) when a resonance capacitor element (Ccmb) having the combined capacitance resonates with the inductance connected in series is expressed in Expression [2] described previously. The state is shown by the graph in FIG. 11(b). The vertical axis indicates a relative value of each value, and the horizontal axis indicates a relative position of the adjustment belt 251. The left end on the horizontal axis means a state immediately before the conductor piece 402 starts to overlap the conductor portion of the elliptical ring-shaped conductor, and rightward movement on the horizontal axis means a state where the adjustment belt 251 is pushed in the central axis 201 direction and the overlapping area of the conductor piece 402 and the conductor portion of the elliptical ring-shaped conductor is increased.

A dotted line graph 1111 shows a change in Cf, and a solid line graph 1112 shows a change in the resonance frequency (fr) in Expression [2]. From FIG. 11(b), it is understood that the stray capacitance and the resonance frequency are changed by sliding the adjustment belt 251 in the central axis 201 direction. Specifically, when the adjustment belt 251 is pushed in the central axis 201 direction, the stray capacitance is increased and the resonance frequency is reduced. On the contrary, when the adjustment belt 251 is pulled out in the central axis 201 direction, the stray capacitance is reduced and the resonance frequency is increased. Therefore, it is understood that the apparent capacitances of a plurality of resonance capacitor elements can be changed collectively by sliding movement for pushing the adjustment belt 251 in the central axis 201 direction or pulling the adjustment belt 251 out in the central axis 201 direction and accordingly the resonance frequency of the elliptical BC coil can be changed and can be tuned so as to match the nuclear magnetic resonance frequency (fc).

Although the tuning procedure of the second embodiment is basically the same as the procedure shown in the flow chart of FIG. 9 described in the first embodiment, "sliding movement direction of the adjustment belt 251 is the central axis 201 direction" and the initial position of the adjustment belt in step 902 are different. The initial position of the adjustment belt 251 is assumed to be a position where about a half of each of the stray capacitance forming portions 502a and 502b of the conductor piece 402 and about a half of the conductor portion of the elliptical ring-shaped conductor element 203 overlap each other. Since the tuning procedure of the second embodiment is the same as the procedure shown in the flowchart of FIG. 9 except for these two points, detailed explanation thereof will be omitted.

In addition, although the case where the adjustment belt 251 slides in the central axis 201 direction has been described in the second embodiment, it is also possible to tune the elliptical BC coil by sliding the adjustment belt 251 in an arbitrary direction along the elliptical cylindrical curved surface in combination with the sliding movement of the elliptical ring-shaped conductor element in the circumferential direction described in the first embodiment.

As described above, in the BC coil and the MRI apparatus using the same of the second embodiment, the apparent capacitances of a plurality of resonance capacitor elements are collectively changed by sliding the adjustment belt of the elliptical BC coil in the central axis direction of the ring-shaped conductor element, thereby tuning the elliptical BC coil. Thus, the same effects as in the first embodiment described above are achieved.

<<Third Embodiment>>

A third embodiment of the BC coil and the MRI apparatus using the same of the present invention will be described. In the first and second embodiments described previously, the examples of the elliptical BC coil are shown. In the third embodiment, however, the tuning mechanism described above is applied to a cylindrical BC coil (hereinafter, referred to as a circular BC coil). Hereinafter, the third embodiment will be described in detail.

First, the overall configuration of a circular BC coil of the third embodiment will be described. FIG. 12 is a diagram when the circular BC coil is obliquely viewed. The circular BC coil is formed in a cylindrical shape as a whole. The circular BC coil is configured to include: 4N (N is a natural number, N=3 in the diagrams) linear conductor elements 1202 disposed in parallel with a central axis 1201 along the cylindrical curved surface; two circular conductor elements 1203a and 1203b disposed along the cylindrical curved surface with a point on the central axis 1201 as the center; 8N (N is a natural number) resonance capacitor elements 1204 inserted in series in each of the two circular conductor elements 1203a and 1203b; first and second feed points 1205a and 1205b for connecting the circular BC coil to a high-frequency circuit; and a tuning mechanism to be described later. Each resonance capacitor element 1204 is inserted in an arc-shaped conductor between connection points 1206 of the circular conductor element 1203 and the linear conductor elements 1202, and the capacitance is approximately the same.

The "4N" linear conductor elements 1202 are disposed at equal distances in the circumferential direction of the cylindrical curved surface. In the example shown in FIG. 12A, four of the "4N" linear conductor elements 1202 are disposed so as to pass through intersections with two orthogonal axes in the radial direction of cylindrical curved surface. The remaining "4(N−1)" linear conductor elements 1202 are disposed at positions that are axisymmetric with respect to the two orthogonal axes in the radial direction of cylindrical curved surface and are also axisymmetric with respect to the central axis 1201.

In the configuration described above, since the circular conductor element 1203 has a circular shape, the inductances of the linear conductor element 1202 and the arc-shaped conductor are symmetrical even if the capacitances of the resonance capacitor elements 1204 are set to be approximately the same. Therefore, the width and the arrangement interval or the arrangement density of the linear conductor elements 1202 in the circumferential direction of the cylindrical curved surface can be made to be approximately the same.

The first and second feed points 1205a and 1205b are disposed at positions at which angles with respect to the center of the cylindrical curved surface are 90° apart from each other in the circumferential direction and at which, when electric power is supplied to one of the feed points, the amplitude of the high-frequency current flowing through the other feed point is minimized.

FIG. 13(*a*) is a developed diagram obtained by cutting an example of the circular BC coil of the third embodiment in parallel with the central axis 1201 and expanding the result to the left and right. Here, a tuning mechanism, which will be described later, is not shown. The left and right direction in FIG. 13(*a*) corresponds to the circumferential direction. The width of the central portion of each linear conductor element 1202 in the circumferential direction is approximately the same. Accordingly, the arrangement interval or the arrangement density of the linear conductor elements 1202 in the circumferential direction (left and right direction in the developed diagram of FIG. 13(*a*)) is approximately the same.

Similar to the elliptical BC coil of the first embodiment described above, each linear conductor 1202 has a central portion (rung portion) having a fixed width and wide portions which are located at both ends and whose widths in the circumferential direction are larger than the width of the rung portion. The wide portions at both ends of the linear conductor 1202 also serve as the circular conductor element 1203. In addition, each linear conductor 1202 is disposed such that a gap is formed between the wide portions of the adjacent linear conductors 1202. The resonance capacitor element 1204 is disposed in a gap between wide portions, and adjacent wide portions are electrically connected (soldered) to each other through the resonance capacitor element 1204. Since the linear conductors 1202 and gaps between their wide portions are disposed at equal distances, the resonance capacitor elements 1204 disposed in the gaps are also disposed at equal distances.

FIG. 13(*b*) shows an adjustment belt 1301 in the tuning mechanism. Since the resonance capacitor elements 1204 are disposed at equal distances, conductor pieces 1302 and slit portions 1303 between the conductor pieces 1302 are also disposed at equal distances. Since the configuration of the adjustment belt 1301 and the shape and function of the conductor piece 1302 are the same as those in the case of the elliptical BC coil described in the first embodiment, detailed explanation thereof will be omitted. The apparent capacitances (that is, a combined capacitance according to the combination with the stray capacitance) of the resonance capacitor elements 1204 are collectively changed by arranging such an adjustment belt 1301 concentrically on the outer periphery of the circular conductor element 1203 and sliding the adjustment belt 1301 in the central axis direction or the circumferential direction of the circular conductor element 1203. The tuning procedure is the same as the process flow of FIG. 9 described in the first embodiment.

As described above, the BC-type RF coil of the present embodiment have a cylindrical shape, and are a circular BC coil in which linear conductors and resonance capacitor elements inserted in series in a circular conductor element are disposed at equal distances in the circumferential direction of the cylindrical curved surface. Conductor pieces disposed in the adjustment belt in the tuning mechanisms are also disposed at equal distances. Accordingly, also in the circular BC coil, the apparent capacitances of the resonance capacitor elements 1204 can be easily changed and adjusted collectively. As a result, since the resonance frequency of the circular BC coil can be easily changed, the resonance frequency of the circular BC coil can be tuned so as to match the nuclear magnetic resonance frequency.

While the embodiments of the present invention have been described above, the present invention is not limited thereto.

REFERENCE SIGNS LIST

1: object
2: static magnetic field generation system
3: gradient magnetic field generation system
4: sequencer
5: signal transmission system
6: signal receiving system
7: signal processing system
8: central processing unit (CPU)
9: gradient magnetic field coil
10: gradient magnetic field power source
11: high-frequency oscillator
12: modulator
13: high-frequency amplifier
14a: high-frequency coil (transmission coil)
14b: high-frequency coil (receiving coil)
15: signal amplifier
16: quadrature phase detector
17: A/D converter
18: storage device
19: external storage device
20: display device
21: input device
25: operating unit

The invention claimed is:

1. A birdcage-type high-frequency coil, comprising:
two ring-shaped conductor elements in which a plurality of resonance capacitor elements are inserted in series; and
a plurality of linear conductor elements electrically connected to the two ring-shaped conductor elements,
wherein an adjustment belt to change apparent capacitances of the plurality of resonance capacitor elements collectively is disposed slidably in a circumferential direction of the ring-shaped conductor element on an outer periphery of at least one of the two ring-shaped. conductor elements with a dielectric member interposed therebetween.

2. The birdcage-type high-frequency coil according to claim 1,
wherein a shape of the ring-shaped conductor element is an ellipse, and
the plurality of linear conductor elements are disposed along an elliptical ring-shaped cylindrical curved surface.

3. The birdcage-type high-frequency coil according to claim 2,
wherein a width of a central portion of the linear conductor element in a circumferential direction of the elliptical ring-shaped cylindrical curved surface is increased toward a long axis direction from a short axis direction of the elliptical ring-shaped cylindrical curved surface.

4. The birdcage-type high-frequency coil according to claim 2,
wherein an arrangement interval of the resonance capacitor elements is increased toward a long axis direction from a short axis direction of the elliptical ring-shaped cylindrical curved surface.

5. The birdcage-type high-frequency coil according to claim 1,
wherein the ring-shaped conductor element is formed by electrically connecting both ends of the linear conductor element to each other through the resonance capacitor element.

6. The birdcage-type high-frequency coil according to claim 1,
wherein a fixing belt that fixes the adjustment belt by tightening the adjustment belt so as to be pressed against the ring-shaped conductor element is disposed on an outer periphery of the adjustment belt.

7. The birdcage-type high-frequency coil according to claim 6,
wherein both ends of the fixing belt are connected to each other, and a fastener to change a distance between both of the ends is provided.

8. A magnetic resonance imaging apparatus using the birdcage-type high-frequency coil according to claim 1.

9. A birdcage-type high-frequency coil, comprising:
two ring-shaped conductor elements in which a plurality of resonance capacitor elements are inserted in series; and
a plurality of linear conductor elements electrically connected to the two ring-shaped conductor elements,
wherein an adjustment belt to change apparent capacitances of the plurality of resonance capacitor elements collectively is slidably disposed on an outer periphery of at least one of the two ring-shaped conductor elements with a dielectric member interposed therebetween,
wherein the adjustment belt has a belt shape, and is formed by arranging a conductor piece and a slit portion, which insulates adjacent conductor pieces from each other, alternately.

10. The birdcage-type high-frequency coil according to claim 9,
wherein the conductor piece is disposed in the adjustment belt so as to be near a position facing the resonance capacitor element in a state where the adjustment belt is disposed on the outer periphery of the ring-shaped conductor element.

11. The birdcage-type high-frequency coil according to claim 9,
wherein the adjustment belt is formed by bonding the conductor pieces on a surface of a belt-shaped insulating member facing the ring-shaped conductor element intermittently in a longitudinal direction of the belt-shaped insulating member.

12. The birdcage-type high-frequency coil according to claim 10,
wherein the conductor piece is formed by arranging two stray capacitance forming portions, which are for forming a stray capacitance with a conductor portion of the ring-shaped conductor element, so as to face each other with a gap portion interposed therebetween, and includes a connecting conductor portion that electrically connects the two stray capacitance forming portions to each other.

13. The birdcage-type high-frequency coil according to claim 10,
wherein the conductor piece has an approximately rectangular shape in which a gap portion is formed on one side of a central portion.

14. A magnetic resonance imaging apparatus using the birdcage-type high-frequency coil according to claim 9.

15. A birdcage-type high-frequency coil, comprising:
two ring-shaped conductor elements in which a plurality of resonance capacitor elements are inserted in series; and
a plurality of linear conductor elements electrically connected to the two ring-shaped conductor elements,
wherein an adjustment belt to change apparent capacitances of the plurality of resonance capacitor elements collectively is slidably disposed on an outer periphery of at least one of the two ring-shaped conductor elements with a dielectric member interposed therebetween,
wherein the adjustment belt has a belt shape, and is formed by arranging a conductor piece and a slit portion. which insulates adjacent conductor pieces from each other, alternately,
wherein the conductor piece is disposed in the adjustment belt so as to be near a position facing the resonance capacitor element in a state where the adjustment belt is disposed on the outer periphery of the ring-shaped conductor element,
wherein the conductor piece is formed by arranging two stray capacitance forming portions, which are for forming a stray capacitance with a conductor portion of the ring-shaped conductor element, so as to face each other with a gap portion interposed therebetween, and includes a connecting conductor portion that electrically connects the two stray capacitance forming portions to each other, and
wherein the apparent capacitances of the plurality of resonance capacitor elements are collectively changed by sliding movement of the adjustment belt in a central axis direction of the ring-shaped conductor element.

16. A magnetic resonance imaging apparatus using the birdcage-type high-frequency coil according to claim 15.

* * * * *